(12) United States Patent
Parnham et al.

(10) Patent No.: US 10,439,086 B2
(45) Date of Patent: Oct. 8, 2019

(54) POLYESTER FILM COMPRISING AMORPHOUS POLYESTER

(71) Applicant: DUPONT TEIJIN FILMS U.S. LIMITED PARTNERSHIP, Chester, VA (US)

(72) Inventors: Emily Parnham, Stockton (GB); Simon V. Mortlock, Dumfries (GB); Allan Lovatt, Middlesbrough (GB); Julian N. Robinson, Easby (GB); Maurice Kieran Looney, Darlington (GB); Paul James Oliver, Billingham (GB)

(73) Assignee: DUPONT TEIJIN FILMS U.S. LIMITED PARTNERSHIP, Chester, VA (US)

( * ) Notice: Subject to any disclaimer, the term of this patent is extended or adjusted under 35 U.S.C. 154(b) by 0 days.

(21) Appl. No.: 15/321,313

(22) PCT Filed: Jul. 8, 2015

(86) PCT No.: PCT/GB2015/051978
§ 371 (c)(1),
(2) Date: Dec. 22, 2016

(87) PCT Pub. No.: WO2016/005746
PCT Pub. Date: Jan. 14, 2016

(65) Prior Publication Data
US 2017/0162734 A1 Jun. 8, 2017

(30) Foreign Application Priority Data
Jul. 8, 2014 (GB) .................................. 1412153.7

(51) Int. Cl.
*H01L 31/049* (2014.01)
*B32B 27/08* (2006.01)
*B32B 27/20* (2006.01)
*B32B 27/30* (2006.01)
*B32B 27/36* (2006.01)

(52) U.S. Cl.
CPC ............ *H01L 31/049* (2014.12); *B32B 27/08* (2013.01); *B32B 27/20* (2013.01); *B32B 27/306* (2013.01); *B32B 27/308* (2013.01); *B32B 27/36* (2013.01); *B32B 2250/24* (2013.01); *B32B 2255/10* (2013.01); *B32B 2255/26* (2013.01); *B32B 2264/102* (2013.01); *B32B 2307/31* (2013.01); *B32B 2307/4026* (2013.01); *B32B 2307/41* (2013.01); *B32B 2307/412* (2013.01); *B32B 2307/518* (2013.01); *B32B 2307/702* (2013.01); *B32B 2307/704* (2013.01); *B32B 2307/712* (2013.01); *B32B 2307/732* (2013.01); *B32B 2307/736* (2013.01); *B32B 2307/744* (2013.01); *B32B 2457/12* (2013.01); *Y02E 10/50* (2013.01)

(58) Field of Classification Search
CPC combination set(s) only.
See application file for complete search history.

(56) References Cited

U.S. PATENT DOCUMENTS

| 3,244,708 | A | | 4/1966 | Duennenberger |
| 3,843,371 | A | | 10/1974 | Piller |
| 4,446,262 | A | | 5/1984 | Okumura |
| 4,619,956 | A | | 10/1986 | Susi |
| 4,681,905 | A | | 7/1987 | Kubota |
| 4,684,679 | A | | 8/1987 | Kutota |
| 4,812,498 | A | | 3/1989 | Nakahara |
| 5,124,435 | A | * | 6/1992 | Mori .................... C08G 63/199 528/307 |
| 5,251,064 | A | | 10/1993 | Tennant |
| 5,264,539 | A | | 11/1993 | Shepherd |
| 5,288,778 | A | | 2/1994 | Schmitter |
| 9,333,692 | B2 | * | 5/2016 | Brennan .............. C08G 63/914 |
| 2004/0097621 | A1 | * | 5/2004 | Macdonald ........ C08G 63/6926 524/117 |
| 2008/0289682 | A1 | * | 11/2008 | Adriani et al. |
| 2010/0065109 | A1 | * | 3/2010 | Hayes et al. |
| 2010/0252101 | A1 | * | 10/2010 | Noguchi et al. |
| 2010/0288353 | A1 | * | 11/2010 | Kliesch et al. |
| 2011/0209747 | A1 | * | 9/2011 | Shi ..................... B29C 47/0021 136/251 |
| 2011/0272005 | A1 | * | 11/2011 | Cheng et al. |

(Continued)

FOREIGN PATENT DOCUMENTS

| EP | 0006686 | 1/1980 |
| EP | 0031202 | 7/1981 |

(Continued)

OTHER PUBLICATIONS

International Search Report and Written Opinion of the International Search Authority for Internatonal Application No. PCT/GB2015/051978, dated Sep. 16, 2015, 10 pages.
GB Search Report for GB Application No. 1412153.7, dated Jan. 8, 2015, 2 pages.
International Preliminary Report on Patentability for International Application No. PCT/GB2015/051978, 6 pages.
European Communication Under Rule 71(3) EPC for European Application No. 15738436.3, dated Jul. 11, 2018, 5 pages.

*Primary Examiner* — Bethany L Martin
(74) *Attorney, Agent, or Firm* — RatnerPrestia

(57) ABSTRACT

A photovoltaic cell comprising a transparent front-plane, an opaque back-plane and an encapsulant resin wherein said back-plane comprises a polyester film comprising a base layer (B) comprising a crystallizable polyester and a heat-sealable layer (A) comprising an amorphous copolyester wherein: (i) said amorphous copolyester is derived from an aliphatic diol and a cycloaliphatic diol and at least one aromatic dicarboxylic acid (ii) said polyester film is disposed in the photovoltaic cell such that layer (A) is in contact with the encapsulant resin.

42 Claims, No Drawings

(56) References Cited

U.S. PATENT DOCUMENTS

| | | | |
|---|---|---|---|
| 2012/0227801 A1* | 9/2012 | Brennan et al. | |
| 2012/0298196 A1* | 11/2012 | Nakagawa et al. | |
| 2012/0328865 A1 | 12/2012 | Riedl | |
| 2013/0323502 A1* | 12/2013 | Hashimoto | C08J 7/047 428/336 |
| 2014/0069495 A1* | 3/2014 | Takanashi et al. | |

FOREIGN PATENT DOCUMENTS

| | | | |
|---|---|---|---|
| EP | 0031203 | 7/1981 | |
| EP | 0076582 | 4/1983 | |
| EP | 1102330 | 5/2001 | |
| EP | 2163580 | 3/2010 | |
| GB | 2488787 | 9/2012 | |
| JP | 2010158828 | 7/2010 | |
| JP | 2011097012 A | 5/2011 | |
| WO | 9405645 | 3/1994 | |
| WO | 0156966 | 8/2001 | |
| WO | 2010041854 | 4/2010 | |
| WO | 2010079798 | 7/2010 | |
| WO | 2011030098 A1 | 3/2011 | |
| WO | 2012063024 | 5/2012 | |
| WO | 2012/120260 * | 7/2012 | H01L 31/048 |
| WO | 2012104668 A1 | 8/2012 | |

* cited by examiner

POLYESTER FILM COMPRISING AMORPHOUS POLYESTER

This application is a National Phase filing of International Application No. PCT/GB2015/051978, filed 8 Jul. 2015, and claims priority benefit of GB Application No. 1412153.7, filed 8 Jul. 2014, the entirety of which applications is incorporated herein by reference for all purposes.

FIELD OF THE INVENTION

The present invention relates to polyester films, to processes for the production thereof, and to uses thereof. The polyester films are particularly suitable for use in photovoltaic (PV) cells, particularly as back-planes in PV cells, and the present invention also relates to PV cells comprising the polyester films, and to processes for the production thereof.

BACKGROUND OF THE INVENTION

The advantageous mechanical properties, dimensional stability and optical properties of polyester films are well-known and are exploited in many areas of technology. Many adaptations of polyester films have been proposed in order to tailor the properties of a polyester film to a particular application. However, an adaptation which improves the performance of a polyester film in one respect may be detrimental to the performance of the film in another respect. For instance, a modification to improve the optical properties of a film may have a detrimental effect on the mechanical properties of the film. Accordingly, it is often difficult to obtain polyester films having a suitable combination of desirable properties.

In order to improve the performance of polyester films, it is known to provide multi-layer films having complementary properties so as to form a composite structure. In some cases, multi-layer films may comprise two or more films of the same type in order to improve the mechanical strength of the film or to intensify other functional properties of the film. Alternatively, multi-layer films may comprise two or more films of different types, thereby enabling the properties of the different polyester films to be realised simultaneously. For example, multi-layer polyester films have been used to improve the handling properties of functional polyester films by disposing one or more films having desirable functional properties onto a base film having desirable mechanical properties. Laminated polyester films may suitably be prepared by co-extrusion, coating or lamination techniques.

The mechanical properties, dimensional stability, flexibility, weight, impact resistance and optical properties of polyester films offer advantages for their use in the manufacture of electronic or opto-electronic devices, such as electroluminescent (EL) display devices (particularly organic light emitting display (OLED) devices), electrophoretic displays (e-paper), photovoltaic (PV) cells and semiconductor devices (such as organic field effect transistors, thin film transistors and integrated circuits generally). The use of flexible polyester film as layer(s) in electronic devices allows the manufacture of such devices in a reel-to-reel process, thereby reducing cost.

A photovoltaic cell generally comprises a front-plane (or front-sheet); a front-side encapsulant material; the photoactive material on an electrode support substrate; a rear-side encapsulant; a rear back-plane (or back-sheet); and various components to collect and manage the electrical charge. Polyester films have been proposed in the manufacture of various layers in PV cells, for instance the front-plane, the back-plane, the electrode support layer(s). Photovoltaic modules, often consisting of many photovoltaic cells, are usually categorized according to the active photovoltaic materials used. These include crystalline silicon, gallium-arsenide (GaAs), amorphous silicon (a-Si), cadmium-telluride (CdTe), copper-indium-gallium-(di)selenide (CIGS), dye-sensitized or organic cells. Photovoltaic cells containing gallium-arsenide, amorphous silicon, cadmium-telluride, copper-indium-gallium-(di)selenide, dye-sensitized or conductive organic material are often referred to as thin-film photovoltaic cells (TFPV cells), which may or may not be flexible. Dye-sensitised PV cells are of particular interest, in which the active light-absorbing layer comprises a dye which is excited by absorbing incident light. Other thin-film silicon PV cells include protocrystalline, nanocrystalline (nc-Si or nc-Si:H) and black silicon PV cells. Thin-film photovoltaic cells are made by depositing one or more thin layers of photovoltaic material on a substrate, the thickness range of a thin layer varying from 1 or 2 nanometers to tens of micrometers, using a variety of deposition methods and a variety of substrates.

The back-plane, in particular, must exhibit good thermal dimensional stability. This has typically been a significant problem for polymeric materials, which tend to exhibit poorer dimensional stability than optical-quality glass or quartz. In PV cells generally, poor dimensional stability of a polymeric layer can result in the cracking of the adjacent encapsulant material, and particularly during the elevated temperatures (typically 130 to 160° C.; typically for up to 30 minutes) and normally also low pressure experienced during manufacture of the device. For instance, prior art films have been observed to exhibit wrinkling and movement during the manufacture of a PV device.

The back-plane should also exhibit good UV-stability. Lack of UV-stability can manifest itself in a yellowing, hazing and cracking of the film on exposure to sunlight thereby decreasing the effective service lifetime of the PV cell.

The encapsulant material is a barrier material which protects the photoactive and electrode layers and provides high resistance to gas and solvent permeation. The encapsulating barrier material is typically utilised in the form of a self-supporting film or sheet, which is applied to the composite comprising photoactive and electrode layers using lamination techniques, typically under vacuum, as is known in the art. The encapsulated composite is then sandwiched between a front-plane and a back-plane.

A problem with prior art devices has been the need for one or more additional primer layer(s) or surface treatment(s) to improve adhesion between the back-plane and the encapsulant. In particular, it has been necessary to coat the back-plane with a first adhesive inter-layer and then a second adhesive layer, wherein the second adhesive layer is a material having high adhesion to the encapsulant of the PV cell or is the same material as the encapsulant. It would be desirable to dispense with both of these additional adhesive layers and the additional process steps required to apply them, in order to increase manufacturing efficiency and reduce costs. In addition, it would be desirable to improve the adhesion between the back-plane and the encapsulant, relative to the prior art devices.

The back-plane should also exhibit good hydrolysis resistance. Poor hydrolytic stability can manifest itself by a reduction in mechanical properties and by the cracking of the film on exposure to moisture or other environmental conditions, particularly under humid conditions and/or elevated temperatures, and particularly on prolonged exposure over an extended period of time. The use of hydrolysis stabilisers in polyester film is well-known and these additives can play an important role in increasing hydrolysis resistance, but the introduction of such additives into polyester film can also have its disadvantages in film production and film quality. For instance, as hydrolysis stabiliser is introduced in increasing amounts, the intrinsic viscosity of the film can be reduced, the film can become discoloured and brittle and exhibit imperfections, and film formation can become difficult.

SUMMARY OF THE INVENTION

It is therefore an object of this invention to provide a polyester film suitable as a back-plane in PV cells which exhibits improved adhesion directly to encapsulant materials, excellent hydrolytic stability and excellent UV stability, and particularly one which is able to be manufactured more efficiently and economically. It is a further object of this invention to dispense with the additional adhesive and primer layers used in existing manufacturing processes to incorporate polyester films as back-planes into PV cells.

According to the present invention, there is provided a photovoltaic cell comprising a transparent front-plane, an opaque back-plane and an encapsulant resin wherein said back-plane comprises a polyester film comprising a base layer (B) comprising a crystallisable polyester, and a heat-sealable layer (A) comprising an amorphous copolyester wherein:
(i) said amorphous copolyester is derived from an aliphatic diol and a cycloaliphatic diol and at least one aromatic dicarboxylic acid; and
(ii) said polyester film is disposed in the photovoltaic cell such that layer (A) is in contact with the encapsulant resin.

According to a further aspect of the present invention, there is provided the use of an amorphous copolyester as an adhesive layer for an opaque back-plane in a photovoltaic cell comprising a transparent front-plane, said back-plane and an encapsulant resin, wherein said back-plane comprises a polyester film comprising a base layer (B) comprising a crystallisable polyester and a heat-sealable layer (A) comprising an amorphous copolyester wherein:
(i) said amorphous copolyester is derived from an aliphatic diol and a cycloaliphatic diol and at least one aromatic dicarboxylic acid; and
(ii) said polyester film is disposed in the photovoltaic cell such that layer (A) is in contact with the encapsulant resin.

DETAILED DESCRIPTION OF THE INVENTION

The present inventors have unexpectedly found that an amorphous copolyester derived from an aliphatic diol and a cycloaliphatic diol and at least one aromatic dicarboxylic acid adheres unexpectedly well to the encapsulant resin, particularly wherein the encapsulant resin is ethylene vinyl acetate (EVA). Further, the inventors found that, surprisingly, such an amorphous copolyester exhibits excellent hydrolytic stability and, furthermore, retains excellent adhesion to the encapsulant material even on exposure to moisture, particularly under humid conditions and/or elevated temperatures, and particularly on prolonged exposure over an extended period of time.

The polyester film is a self-supporting film or sheet by which is meant a film or sheet capable of independent existence in the absence of a supporting base. The film is preferably uniaxially or biaxially oriented, preferably biaxially oriented.

The polyester(s) which constitute the film is/are typically synthetic linear polyester(s). Suitable polyesters are obtainable by condensing one or more dicarboxylic acid(s) or their lower alkyl (up to 6 carbon atoms) diesters with one or more diols. The dicarboxylic acid component contains at least one aromatic dicarboxylic acid, which is preferably terephthalic acid, isophthalic acid, phthalic acid, 1,4-, 2,5-, 2,6- or 2,7-naphthalenedicarboxylic acid, and is preferably terephthalic acid (TA) or 2,6-naphthalenedicarboxylic acid, and preferably terephthalic acid. The polyester may also contain one or more residues derived from other dicarboxylic acids such as 4,4'-diphenyldicarboxylic acid, hexahydro-terephthalic acid, 1,10-decanedicarboxylic acid, and in particular aliphatic dicarboxylic acids including those of the general formula $C_nH_{2n}(COOH)_2$ wherein n is 2 to 8, such as succinic acid, glutaric acid sebacic acid, adipic acid, azelaic acid, suberic acid or pimelic acid, preferably sebacic acid, adipic acid and azelaic acid, and more preferably azelaic acid. The diols are preferably selected from aliphatic and cycloaliphatic glycols, e.g. ethylene glycol (EG), 1,3-propanediol, 1,4-butanediol and 1,4-cyclohexanedimethanol (CHDM), and preferably from ethylene glycol (EG) and 1,4-cyclohexanedimethanol (CHDM) as described hereinbelow. The film-forming polyester resin is the major component of the film, and makes up at least 50% by weight of the total weight of a given layer, preferably at least 65%, typically at least 80%, more typically at least 90%, more typically at least 95%, and in one embodiment at least 99% by weight of the total weight of a given layer.

The polyester of the base layer (B) is a crystallisable polyester. The polyester of the base layer (B) is preferably derived from the carboxylic acids (preferably the aromatic dicarboxylic acids) and glycols described above. Preferably the polyester of the base layer (B) contains only one dicarboxylic acid, preferably an aromatic dicarboxylic acid, preferably terephthalic acid or 2,6-naphthalenedicarboxylic acid, and preferably terephthalic acid. Preferably the polyester of the base layer (B) contains only one glycol, preferably an aliphatic glycol, preferably ethylene glycol. Preferably the polyester contains one aromatic dicarboxylic acid and one aliphatic glycol. Polyethylene terephthalate (PET) or polyethylene 2,6-naphthalate (PEN), particularly PET, is the preferred polyester of the base layer. The polyester of the base layer (B) may optionally contain relatively minor amounts of one or more residues derived from the other dicarboxylic acids and/or diols described above, and where such minor amounts are present then the total amount of said other dicarboxylic acid(s) is preferably less than 10 mol %, preferably less than 5 mol %, preferably less than 1 mol % of the total dicarboxylic acid fraction of the polyester of the base layer and/or the total amount of said other diol(s) is preferably less than 15 mol %, preferably less than 10 mol %, preferably less than 5 mol % of the total diol fraction of the polyester of the base layer. The polyester of the base layer (B) is the major component of the layer and makes up at least 50% by weight of the total weight of the layer, preferably at least 65%, preferably at least 70%, more preferably at least 80% by weight of the total weight of the layer. The base layer (B) may optionally comprise a minor amount of the amorphous copolyester described hereinbelow for the heat-sealable layer (A) such that said amorphous copolyester is present in amounts of no more than about 10%, preferably no more than about 8%, preferably no more than about 5%, preferably no more than about 4%, preferably no more than about 3% by weight, preferably no more than about 2% by weight, based on the total weight of the layer.

The intrinsic viscosity of the polyester from which the base layer (B) is manufactured is preferably at least about 0.60 preferably at least about 0.65, preferably at least about 0.70, preferably at least about 0.75, and preferably at least about 0.80. Preferably, the intrinsic viscosity of the polyester is not more than 0.85, preferably not more than 0.83. Preferably, the intrinsic viscosity of the polyester is at least 0.61. The use of polyesters with a relatively higher intrinsic viscosity provides improved hydrolysis stability, although too high a viscosity can lead to difficulties in film manufacture and/or require specialised, more robust film-forming equipment. For instance, increasing the viscosity too greatly may mean that it is appropriate to reduce output (i.e. reduce the amount of polyester extruded per unit time, which leads to a less economical process) or to increase the extrusion temperature in order to reduce the viscosity of the melt (which in turn can lead to thermal degradation of the polymer and the loss of associated properties) in order to achieve stable film production.

The copolyester of heat-sealable layer (A) is preferably derived from the carboxylic acids (preferably the aromatic dicarboxylic acids) and glycols described above. Preferably the copolyester of heat-sealable layer (A) contains only one dicarboxylic acid, preferably an aromatic dicarboxylic acid, preferably terephthalic acid. Preferred aliphatic glycols are ethylene glycol and butane diol, more preferably ethylene glycol. Preferably the copolyester of heat-sealable layer (A) contains only one aliphatic glycol, preferably ethylene glycol. A preferred cycloaliphatic glycol is 1,4-cyclohexanedimethanol. Preferably the copolyester of heat-sealable layer (A) contains only one cycloaliphatic diol, preferably 1,4-cyclohexanedimethanol. A preferred copolyester is derived from terephthalic acid, ethylene glycol and 1,4-cyclohexanedimethanol. The preferred molar ratios of the cycloaliphatic diol to the aliphatic diol are in the range from 10:90 to 70:30, preferably 10:90 to 60:40, preferably in the range from 20:80 to 40:60, and more preferably from 30:70 to 35:65. Thus, it is preferred that the glycol fraction of the copolyester comprises from 10 to 70 mol %, preferably 10 to 60 mol %, preferably 20 to 40 mol %, preferably 30 to 35 mol % cycloaliphatic diol and from 30 to 90 mol %, preferably 40 to 90 mol %, preferably 60 to 80 mol %, preferably 65 to 70 mol % aliphatic diol. In a preferred embodiment this copolyester is a copolyester of terephthalic acid wherein the glycol fraction comprises about 33 mol % 1,4-cyclohexanedimethanol and about 67 mol % ethylene glycol. An example of such a polymer is Skygreen™ S2008 or PN100 (SK Chemicals) or PETG™6763 (Eastman) which comprises a copolyester of terephthalic acid and a glycol fraction comprising about 33% 1,4-cyclohexane dimethanol and about 67% ethylene glycol and which is always amorphous. The copolyester of heat-sealable layer (A) may optionally contain relatively minor amounts of one or more residues derived from the other dicarboxylic acids and/or diols described above, and where such minor amounts are present then the total amount of said other dicarboxylic acid(s) is preferably less than 10 mol %, preferably less than 5 mol %, preferably less than 1 mol % of the total dicarboxylic acid fraction of the copolyester of heat-sealable layer (A) and/or the total amount of said other diol(s) is preferably less than 10 mol %, preferably less than 5 mol %, preferably less than 1 mol % of the total diol fraction of the copolyester of heat-sealable layer (A). The copolyester resin of heat-sealable layer (A) is the major component of the layer, and makes up at least 50% by weight of the total weight of the layer, preferably at least 65%, preferably at least 80%, preferably at least 90%, more typically at least 95% by weight of the total weight of the layer.

The intrinsic viscosity (IV) of the copolyester from which heat-sealable layer (A) is manufactured is preferably at least about 0.65, preferably at least 0.68, preferably at least about 0.70, and preferably no more than about 0.85, preferably no more than about 0.80. If the IV is too high, this may give rise to poor film profile and difficulties in processing and manufacturing the film. If the IV is too low, the hydrolytic stability is impaired.

The heat-sealable layer (A) may comprise a blend of two or more of said amorphous copolyesters (and typically a blend of only two of said copolyesters) wherein each of said amorphous copolyesters is preferably derived from the carboxylic acids and glycols described hereinabove. The amorphous copolyesters in a blend may be derived from the same carboxylic acids and glycols, optionally with the same molar ratios of comonomers, such that the copolyesters differ in their IV. Thus, the heat-sealable layer (A) may comprise a first amorphous copolyester comprising a first carboxylic acid and first and second glycols, for instance TA/EG/CHDM, and a second amorphous copolyester comprising the same monomer units, wherein the first copolyester has a relatively high IV and the second copolyester has a relatively low IV.

Formation of the polyesters is conveniently effected in a known manner by condensation or ester interchange, generally at temperatures up to about 295° C. In a preferred embodiment, solid state polymerisation may be used to increase the intrinsic viscosity of crystallisable polyesters to the desired value, using conventional techniques well-known in the art, for instance using a fluidised bed such as a nitrogen fluidised bed or a vacuum fluidised bed using a rotary vacuum drier. In the following description of polymer and film manufacture, it will be understood that the term "polyester" includes "copolyester".

Formation of the multilayer polyester film of the present invention may be effected by conventional techniques, including co-extrusion, lamination and coating techniques well-known in the art, and most preferably by co-extrusion. In general terms the co-extrusion process comprises the steps of co-extruding the respective polyester compositions through independent orifices of a multi-orifice die, and thereafter uniting the still molten layers or, preferably, by single-channel co-extrusion in which molten streams of the respective polyesters are first united within a channel leading to a die manifold, and thereafter extruded together from the die orifice under conditions of streamline flow without intermixing thereby to produce a laminated film. The extrusion is generally carried out at a temperature within the range of from about 250 to about 300° C., and is followed by quenching the extrudate and orienting the quenched extrudate. Preferably the amorphous copolyester which forms the heat-sealable layer (A) is extruded at a temperature which is lower than that used for the extrusion of the polyester which forms the base layer (B). Preferably the amorphous copolyester is extruded at a temperature from about 250 to about 290° C., and preferably no higher than about 280° C. and preferably from about 270 to about 280° C. Preferably the polyester which forms the base layer (B) is extruded at a temperature from about 270 to about 300° C., preferably from about 280 to about 300° C.

Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. In one embodiment, the heat-set-temperature is within the range of from about 200 to about 225° C., which provides unexpected improvements in hydrolytic stability. After heat-setting the film is typically quenched rapidly in order induce the desired crystallinity of the polyester.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The polyester film of the invention preferably exhibits a low shrinkage, preferably less than 3%, preferably less than 2%, preferably less than 1.5%, and preferably less than 1.0% at 150° C. over 30 minutes, particularly in the machine (longitudinal dimension) of the film. Preferably such low shrinkage values are exhibited in both dimensions of the film (i.e. the longitudinal and transverse dimensions).

The polyester film of the present invention exhibits a high level of film uniformity and quality, as well as resistance to hydrolytic degradation. In particular, the films of the present invention have a low level profile defects and/or die-lines, uniform thickness and light transmission properties, and excellent processability, with no defects or breakage in the film web.

The polyester film preferably comprises one or more hydrolysis stabiliser(s), and these may be present in the base layer (B) and/or heat-sealable layer (A), and/or may in the optional polyester layer (C) described hereinbelow. Preferably the hydrolysis stabiliser is selected from a glycidyl ester of a branched monocarboxylic acid, wherein the monocarboxylic acid has from 5 to 50 carbon atoms, and wherein said glycidyl ester is present in the form of its reaction product with at least some of the end groups of the polyester. In the following discussion, the hydrolysis stabiliser is illustrated and exemplified with reference to the glycidyl ester.

The total amount of hydrolysis stabiliser present in the film is preferably in the range of from about 0.10 to about 5.0 mol %, more preferably from about 0.20 to about 2.5 mol %, more preferably from about 0.25 to about 1.5 mol %, more preferably from about 0.35 to about 1.0 mol %, more preferably from about 0.40 to about 0.70 mol %, based on the amount of polyester in the film. The inventors have found that if too much hydrolysis stabiliser is incorporated into the film, the intrinsic viscosity may be reduced, the film may become discoloured (yellowness) and brittle, interlayer adhesion may deteriorate, phase separation of the hydrolysis stabiliser and the polyester may occur, and film formation may become difficult. The hydrolysis stabiliser is preferably present in a given layer in an amount that is independently in the range of from about 0.10 to about 5.0 mol %, more preferably from about 0.20 to about 2.5 mol %, more preferably from about 0.25 to about 1.5 mol %, more preferably from about 0.35 to about 1.5 mol %, more preferably from about 0.40 to about 0.70 mol %, based on the amount of polyester in the respective layer.

A single glycidyl ester may be used in a given layer of the film, and where a glycidyl ester is used in a plurality of the layers of the film, the single glycidyl ester used in each of said layers is preferably the same. However, in a preferred embodiment a mixture of glycidyl esters is used in a given layer of the film, and where a mixture of glycidyl esters is used in a plurality of the layers of the film, the same mixture of glycidyl esters is used in each of said layers. As used herein, the term "the glycidyl ester" shall be interpreted as referring to "the glycidyl ester component", and thus encompasses embodiments in which a single glycidyl ester is used and those in which a mixture of different glycidyl esters is used.

The glycidyl ester(s) described herein is/are preferably used according to the invention in the absence of other hydrolysis stabilisers (i.e. in the absence of a hydrolysis stabiliser which is not a glycidyl ester of a branched monocarboxylic acid) and in one embodiment in the absence of glycidyl ether compound(s), particularly di- or poly-glycidyl ether compounds.

Suitable glycidyl esters are those derived from branched monocarboxylic acids having from 5 to 50 carbon atoms, preferably from 5 to 25 carbon atoms, preferably from 5 to 15 carbon atoms, preferably from 8 to 12 carbon atoms, preferably from 9 to 11 carbon atoms, and in one embodiment has 10 carbon atoms. The monocarboxylic acid is preferably saturated, i.e. the carbon-carbon bonds in the molecule are all single bonds. Particularly preferred branched monocarboxylic acids include those in which the carbon atom adjacent the carboxylic acid group (hereinafter referred to as the "α-carbon" atom) is a tertiary carbon atom, i.e. it is attached via three carbon-carbon single bonds to three carbon atoms other than the carbon atom of the carboxylic acid group, and each of said three carbon atoms may be part of an alkylene group or an alkyl group. The monocarboxylic acid is preferably a synthetic material, i.e. it is manufactured via organic synthesis comprising at least one synthetic step according to conventional procedures (see for instance WO-01/56966-A1), rather than a naturally occurring material (such as a fatty acid) which may require isolation from a naturally occurring substance.

The glycidyl esters may easily be manufactured by the known reaction of epichlorohydrin with the desired branched monocarboxylic acid. The reaction may be conducted using conventional acidic or basic catalysts, such as alkali metal carboxylates and quaternary ammonium halides, typically at elevated temperatures (temperatures in the range of 50 to 120° C. are typical).

Preferred glycidyl esters are those having the formula (I):

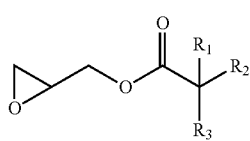

(I)

wherein:
$R^1$ and $R^2$ are independently selected from alkyl,
$R^3$ is selected from hydrogen and alkyl, and preferably from alkyl; and
wherein the total number of carbon atoms in the groups $R^1$, $R^2$ and $R^3$ is from 3 to 48, preferably from 3 to 23, preferably from 3 to 13, preferably from 6 to 10, preferably from 7 to 9, and preferably 8.

Preferably, at least one of $R^1$ and $R^2$ is methyl. More preferably, $R^1$ is methyl and $R^2$ is an alkyl group comprising at least 2 carbon atoms.

Where a mixture of glycidyl esters is used in a given layer of the film, each of the glycidyl esters is independently selected according to formula (I), and preferably such that the total number of carbon atoms in the alkyl groups $R^1$, $R^2$ and $R^3$ in each glycidyl ester of the mixture is the same.

Preferably, $R^1$ is methyl, and $R^2$ and $R^3$ are independently selected from alkyl groups such that the total number of carbon atoms in $R^2$ and $R^3$ is from 2 to 47, preferably from 2 to 22, preferably from 2 to 12, preferably from 5 to 9, preferably from 6 to 8, and in one embodiment the total number of carbon atoms in $R^2$ and $R^3$ is 7. In further embodiments, a mixture of these preferred glycidyl esters is used, preferably such that the total number of carbon atoms in the alkyl groups $R^1$, $R^2$ and $R^3$ in each component of the mixture is the same.

As used herein, the term "alkyl" preferably refers to an unsubstituted straight-chain acyclic hydrocarbon group of formula $[-C_nH_{2n+1}]$.

The glycidyl esters described above include chiral compounds. Chiral glycidyl esters may be present as either enantiomer or as a mixture of enantiomers. Generally, any chiral glycidyl esters will be present as a racemic mixture.

The glycidyl ester or mixture of glycidyl esters preferably has a viscosity of less than 100 mPa·s, preferably less than 50 mPa·s, preferably less than 25 mPa·s at 20° C., measured according to ASTM D445.

The glycidyl esters used in the present invention react with the polyesters (i.e. including the copolyesters) described above at elevated temperatures, typically between about 160° C. and 300° C., and do so with rapid reaction times, typically much less than 1 second at 290° C. The reaction is a ring-opening addition of the carboxyl or hydroxyl end-groups of the polyester to the oxirane ring of the glycidyl ester and proceeds with zero elimination of by-products, both during manufacture of the modified polyester and during subsequent manufacture and use of the polyester film.

The glycidyl ester component can be introduced at various stages during the film-making process, namely:

1. By adding the glycidyl ester during manufacture of the polyester from its monomers. The glycidyl ester is preferably added at the end of the polymerisation process, immediately prior to extrusion of the polyester into pellets. In one embodiment, the modified polyester may then be further treated by solid state polymerisation in order to increase the IV to a desired value.
2. By reacting the glycidyl ester with polyester pellets off-line by melting the pellets, mixing the melt with the additive, then re-extruding the modified polyester into pellets.
3. By adding the glycidyl ester (typically as a liquid) to the polyester pellets prior to or during the introduction of the polyester into the extruder used in the film-manufacturing process (for instance by adding the glycidyl ester to the polyester in the hopper of the extruder). The glycidyl ester and the polyester react in the extruder as the mixture is extruded. Preferably a twin-screw extruder is used.
4. By injecting the glycidyl ester (typically as a liquid) into the molten polyester during the extrusion process (i.e. once the polyester is in the molten state within the extruder, typically a twin-screw extruder, and typically after the polyester has passed through any devolatilisation zone) but prior to the polyester being cast into a film.
5. By adding the glycidyl ester during manufacture of the polyester from its monomers, wherein the polyester is extruded directly into a film. The glycidyl ester is preferably added to the polyester melt at the end of the polymerisation process, immediately prior to extrusion of the polyester into a film.

The glycidyl ester is preferably introduced via one of routes (2) to (5) above, preferably via route (4) or (5). In one embodiment, a masterbatch is produced by adding an excess amount of glycidyl ester, relative to the amount desired in the final film, and this is of particular utility for route (2).

Surprisingly improved product performance is observed using process route (4), and in particular films manufactured by this route demonstrate improved hydrolysis stability, relative to films manufactured using masterbatch technology with route (2) above. It is believed that the relatively late addition of glycidyl ester to the polyester in the extrusion process minimises the increase of carboxyl end-groups caused by thermal degradation during film manufacture. In addition, the advantage of route (4) over the masterbatch route, for example, is that it allows greater use of reclaim film (i.e. waste film from the film manufacturing process, for instance, resulting from "edge-trimming" typically performed after the stenter stage in order to provide a film of uniform width). Reclaimed polyester typically has a lower intrinsic viscosity, and a higher concentration of carboxyl end-groups, than virgin polyester chip and the relatively late addition of the glycidyl ester allows the end-groups of both the virgin and reclaim polyester to be modified. The ability to use higher levels of reclaim while providing improved hydrolysis stability is a particular advantage of the present invention.

The direct extrusion process of route (5) is referred to herein as "coupled polymerisation-film production" or "close-coupled polymerisation-film production". This process dispenses with the intermediate step of pelletisation, and is particularly advantageous. A close-coupled process may be operated with a static or dynamic mixing arrangement between polymerisation reactor and film die, wherein the mixing is effected after addition of the glycidyl ester. Static and dynamic mixing systems are conventional in the art. In a static mixing arrangement, the arrangement of non-moving elements continuously blends the materials as the melt-stream flows through the mixer. Suitable dynamic mixing systems include extruders or other Archimedean screw systems. In a preferred embodiment of the present invention, the close-coupled process is operated with a static mixing arrangement, and it has been surprisingly observed that sufficient mixing to achieve the benefits of the invention can be obtained with only a static mixing arrangement. It is surprising that a close-coupled process applied to this system is able to dispense with dynamic mixing without detriment to the final film properties. In the close-coupled process, an intervening solid state polymerisation step may be, and preferably is, avoided. The close-coupled process reduces the amount of water present in the polymer, thereby avoiding the need for a drying step prior to film formation, and also reducing side reactions between water and the glycidyl ester. The reduced water content allows the intervening solid state polymerisation step to be dispensed with, and allows the polyester film to tolerate a higher carboxyl end-group content without loss of hydrolytic stability. Thus, in this embodiment, the carboxyl end-group content is typically in the range of from about $15 \times 10^{-6}$ to about $50 \times 10^{-6}$ milliequivalents/g (meq/g), more typically from about $20 \times 10^{-6}$ to about $40 \times 10^{-6}$ meq/g, whereas a typical SSP process reduces the carboxyl end-group content to less than about $15 \times 10^{-6}$ meq/g, and typically about $10 \times 10^{-6}$ meq/g. Carboxyl content is determined by titration with sodium hydroxide after dissolution of the polymer in hot benzyl alcohol.

In three alternative embodiments, the polyester film comprises hydrolysis stabiliser in base layer (B) but not heat-sealable layer (A); or the polyester film comprises hydrolysis stabiliser in heat-sealable layer (A) but not base layer (B); or the polyester film does not comprise hydrolysis stabiliser in either base layer (B) or heat-sealable layer (A). In each of these three alternative embodiments, hydrolysis stabiliser may or may not be present in the optional polyester layer (C) described hereinbelow, making a total six alternative embodiments. In a preferred embodiment, the polyester film comprises hydrolysis stabiliser in at least base layer (B) and optionally also in heat-sealable layer (A), and in a more preferred embodiment the polyester film comprises hydrolysis stabiliser in base layer (B) but not in heat-sealable layer (A). It will be understood that, in accordance with the present invention, each of these alternative and preferred embodiments may be utilised in a single film with any of the other preferred features of the invention in the same way as the preferred embodiment of the use of hydrolysis stabilisers described immediately hereinabove.

Preferably, where a glycidyl ester is present in a given layer of the film, that layer further comprises at least one metal cation selected from the group consisting of Group I and Group II metal cations. Preferably, the reaction of the glycidyl ester with the polyester of a given layer of the film is carried out in the presence of at least one metal cation selected from the group consisting of Group I and Group II metal cations. Thus, the metal cations are suitably present a given layer of the film in an amount sufficient to catalyse the reaction between the hydrolysis stabiliser and at least some of the end-groups of the polyester. Preferably, the amount of the metal cation present in a given layer, and/or present in the reaction mixture during the reaction of the hydrolysis stabiliser with the end-groups of the polyester of a given layer, is at least 10 ppm, preferably at least 15 ppm, at least 40 ppm, preferably at least 45 ppm, preferably at least 65 ppm, preferably at least 80 ppm, and preferably at least 100 ppm by weight, relative to the amount of polyester. Preferably, the amount of the metal cation is not more than about 1000 ppm, preferably not more than about 500 ppm, preferably not more than about 275 ppm, typically not more than about 200 ppm, and in one embodiment not more than about 150 ppm by weight, relative to the amount of polyester in a given layer. Preferably, the amount of the metal cation is in the range from 45 ppm to 500 ppm, more preferably from 65 ppm to 275 ppm, more preferably from 100 ppm to 200 ppm by weight, relative to the amount of polyester in a given layer.

As used herein, the terms "Group I" and "Group II" have their conventional chemical meaning and refer to the corresponding Groups in the periodic table. In a preferred embodiment, the metal cations are selected from Group I metal cations, preferably selected from sodium and potassium, and most preferably sodium.

The catalytic effect of the Group I or Group II cation is not dependent on the associated anion, and therefore any appropriate counter-ion may be used. In one embodiment, the anion may be selected from hydroxide, polyacrylate, hydrogen carbonate, carboxylate, chloride, acetate, formate and nitrate. In a preferred embodiment, the anion is selected from hydroxide or polyacrylate. Suitable polyacrylates include those having a molecular weight of from about 1,000 to about 10,000.

The metal cation(s) may be added to the polyester or its monomers prior to or simultaneously with, the addition of the glycidyl ester. Alternatively, the metal cation(s) may be added to the glycidyl ester prior to or simultaneously with the addition of said glycidyl ester to the polyester or its monomers. Preferably, the metal cation(s) are added to the polyester or its monomers, and preferably prior to the addition thereto of the glycidyl ester. In a preferred embodiment, the metal cations are added at the start of the polymerisation reaction to prepare the polyester.

The polyester film preferably comprises a UV-stabiliser, which may be present in the base layer (B) and/or the heat-sealable layer (A), and may also be present in the optional polyester layer (C) described hereinbelow. Compounds suitable for use as UV-stabilisers have an extinction coefficient much higher than that of the polyester, such that most of the incident UV light is absorbed by the UV-stabiliser rather than by the polyester. The UV-stabiliser generally dissipates the absorbed energy as heat, thereby avoiding degradation of the polymer chain. Typically, the UV-stabiliser is an organic UV-stabiliser, and suitable examples include those disclosed in Encyclopaedia of Chemical Technology, Kirk-Othmer, Third Edition, John Wiley & Sons, Volume 23, Pages 615 to 627. Particular examples of UV-stabilisers include benzophenones, benzotriazoles (U.S. Pat. Nos. 4,684,679, 4,812,498 and 4,681,905), benzoxazinones (U.S. Pat. Nos. 4,446,262, 5,251,064 and 5,264,539) and triazines (U.S. Pat. Nos. 3,244,708, 3,843,371, 4,619,956, 5,288,778 and WO 94/05645). The UV-stabiliser may be incorporated into the film according to one of the methods described herein. In one embodiment, the UV-stabiliser may be chemically incorporated in the polyester chain. EP-A-0006686, EP-A-0031202, EP-A-0031203 and EP-A-0076582, for example, describe the incorporation of a benzophenone into the polyester chain. The specific teaching of the aforementioned documents regarding UV-stabilisers is incorporated herein by reference. In a particularly preferred embodiment, improved UV-stability in the present invention is provided by triazines, more preferably hydroxyphenyltriazines, and particularly hydroxyphenyltriazine compounds of formula (II):

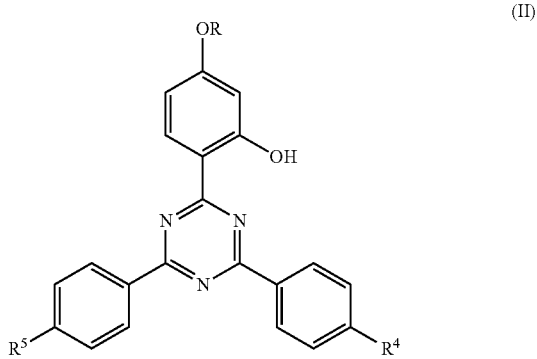

(II)

wherein R is hydrogen, $C_1$-$C_{18}$ alkyl, $C_2$-$C_6$ alkyl substituted by halogen or by $C_1$-$C_{12}$ alkoxy, or is benzyl and $R^4$ and $R^5$ are independently selected from hydrogen, alkyl, alkoxy or phenyl. R is preferably $C_1$-$C_{12}$ alkyl or benzyl, more preferably $C_3$-$C_6$ alkyl, and particularly hexyl. $R^4$ and $R^5$ are preferably hydrogen. An especially preferred UV-stabiliser is 2-(4,6-diphenyl-1,3,5-triazin-2-yl)-5-(hexyl)oxy-phenol, which is commercially available as Tinuvin™ 1577 from BASF, and which is a compound of formula (II) above, wherein R is $C_6H_{13}$ and $R^4$ and $R^5$ are both H. A further especially preferred UV-stabiliser is a 2-(2'-hydroxyphenyl)-4,6-diphenyl triazine which is commercially available as Tinuvin™ 1600 from BASF, and which is a triazine of formula (II) above, wherein R is $CH_2CH(C_2H_5)C_4H_9$, $R^4$ is phenyl and $R^5$ is hydrogen.

The amount of UV-stabiliser in a given layer is preferably in the range from 0.1% to 10%, more preferably 0.1% to 5%, more preferably 0.2% to 1.5% by weight, relative to the total weight of the layer. The amount of UV-stabiliser depends, inter alia, on the identity of the UV-stabiliser and on the identity of other components present in the layer, such as the identity of any particulate filler present in the layer, as described hereinbelow. Thus, a preferred range for the Tinuvin™ 1600 triazine is from about 0.25 to about 0.75% by weight, and a preferred range for the Tinuvin™ 1577 triazine is from about 0.5 to about 1.2% by weight, relative to the total weight of the layer. For embodiments in which $TiO_2$ (or other photoactive particulate filler) is present in the layer in the preferred amounts described hereinbelow then the amount of UV-stabiliser is preferably in the lower half of the afore-mentioned preferred ranges; and for embodiments in which $BaSO_4$ (or other non-photoactive particulate filler) is present in the layer in the preferred amounts described hereinbelow then the amount of UV-stabiliser is preferably present in an amount which is at least the mid-point of and preferably in the upper half of the afore-mentioned preferred ranges. Where a layer is described herein as containing no or substantially no UV-stabiliser, this means no or substantially no organic UV-stabiliser.

The base layer (B) preferably comprises a particulate filler material. Particulate fillers are useful to improve handling and windability properties of polyesters films during manufacture. In the context of the present invention, the particulate filler is used in the base layer (B) primarily to modulate its optical properties. The particulate filler is preferably a particulate inorganic filler, for example metal or metalloid oxides, such as alumina, titania, talc and silica (especially precipitated or diatomaceous silica and silica gels), calcined china clay and alkaline metal salts (such as the carbonates and sulphates of calcium and barium). Where a glycidyl ester hydrolysis stabiliser is present in the base layer (B), it is preferred that the particulate filler is selected from materials other than silica. Where the filler is titania, the filler particles are preferably coated with a coating comprising or consisting of at least one metal oxide selected from alumina and zirconia, and preferably alumina, and preferably said coating does not contain silica (particularly when the base layer (B) comprises a glycidyl ester hydrolysis stabiliser).

The inorganic filler present should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 µm, more preferably 0.05 to 1.5 µm, and particularly 0.15 to 1.2 µm. Preferably at least 90%, more preferably at least 95% by volume of the inorganic filler particles are within the range of the volume distributed median particle diameter±0.8 µm, and particularly ±0.5 µm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

The amount of particulate filler present in the base polyester layer (B) is preferably in the range of from about 0.3 to about 30% by weight, preferably in the range of from about 2.0 to about 25% by weight, based on the weight of polyester in the layer, preferably at least about 3% by weight, and preferably no more than about 20% by weight. The amount of particulate filler depends, inter alia, on the identity of filler. Thus, where the particulate filler is selected from $BaSO_4$, the filler is preferably present in an amount of from 10% to about 20%, preferably from about 15% to about 20% by weight, based on the weight of polyester in the layer. Where the particulate filler is selected from $TiO_2$, the filler is preferably present in an amount of from 3% to about 15%, preferably from about 3% to about 10% by weight, preferably from about 3% to about 7%, based on the weight of polyester in the layer.

Preferably, the particulate filler is used as an opacifying agent to increase the opacity of the base layer (B), such that the base layer (B) is opaque and preferably exhibits a Transmission Optical Density (TOD) of at least 0.3, preferably at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. In some embodiments, the particulate filler is selected such that the base layer (B) is white, grey or black.

Preferably, the particulate filler is selected such that the base layer (B) is an opaque white layer. Films according to this embodiment of the invention preferably exhibit a TOD in the range of at least about 0.3, preferably at least about 0.4, preferably at least 0.5, preferably at least 0.6, preferably at least 0.7, and typically no more than about 1.75. Preferred particulate fillers having a whitening effect include particulate inorganic fillers, preferably titanium dioxide and/or barium sulphate, and preferably either titanium dioxide or barium sulphate, and these are preferably present in the amounts described hereinabove. A white film preferably exhibits a whiteness index, measured as herein described, in the range of from about 60 to about 120 units.

In an alternative embodiment, the particulate filler is selected such that the base layer (B) is an opaque grey or black layer. Films according to this embodiment of the invention typically exhibit a TOD of at least 2.0, more typically at least 3.0, more typically at least 4.0. Preferred particulate fillers having a darkening effect layer include carbon black and metallic fillers, such as aluminium powder. Carbon black is a preferred opacifying agent. In the case of a black or grey base layer (B), the amount of filler present in the base layer (B) is typically in the range of from about 0.3% to about 10% by weight, preferably 0.5% to 7% by weight, particularly 1% to 5% by weight, and especially 2% to 4% by weight, based on the weight of the polyester in the layer. The opacifying agent suitably has a mean particle diameter in the range from 0.01 to 1.5 µm, particularly 0.02 to 0.05 µm.

In a further embodiment, base layer (B) may comprise a combination of particulate fillers having and whitening effect with particulate fillers having a darkening effect. Suitable fillers are as described above, and the total amount of fillers in the base layer (B) is preferably in the range of from 1% to 30% by weight, preferably 2% to 20% by weight, based on the weight of polyester in the layer. Films according to this embodiment of the invention typically exhibit a TOD of at least 1.0, more preferably at least 2.0 and more preferably at least 3.0.

Heat-sealable layer (A) may be free of particulate filler or may contain the same or different type of particulate filler to base layer (B) and/or may contain the same or different amount of particulate filler to base layer (B). Suitable particulate fillers, where present, may be selected from the particulate fillers described above. Preferred particulate filler materials for use in heat-sealable layer (A) are selected from titanium dioxide, silica and/or talc, and preferably the particulate filler is titanium dioxide. Where a glycidyl ester hydrolysis stabiliser is present in the heat-sealable layer (A), it is preferred that the particulate filler is selected from materials other than silica and is preferably titanium dioxide. Preferably, the amount of particulate filler in heat-sealable layer (A) is less than the amount of particulate filler in base layer (B), and preferably the amount of filler in heat-sealable layer (A) is less than 50%, more preferably less than 20% and most preferably less than 10% by weight of the amount of particulate filler in base layer (B). Heat-sealable layer (A) may be free of particulate filler or may contain particulate filler only in minor amounts. Thus, the layer may contain no more than 2.5% by weight, or no more than 2% by weight, or no more than 1% by weight, or no more than 0.6% by weight, or no more than about 0.3% by weight, based on the weight of the polyester in the layer. The particulate filler in heat-sealable layer (A) may be included for the purpose of improving handling of the film, for instance windability (i.e. the absence of blocking or sticking when the film is would up into a roll). In a preferred embodiment, the heat-sealable layer (A) comprises titanium dioxide particles in minor amounts for the purpose of reducing or eliminating yellowing of the film upon prolonged exposure to UV-containing light and, accordingly, the layer preferably comprises titanium dioxide particles in an amount of at least 0.3%, preferably at least 1.0%, preferably at least 2.0%, and preferably no more than 4.0%, preferably no more than 3.0%, preferably less than 3.0% and preferably no more than 2.5% by weight based on the weight of the polyester in the layer, and particularly preferred ranges are from 2.0 to 4.0% and from 0.3 to less than 3.0% (or no more than 2.5%) by weight, based on the weight of the polyester in the layer. The inventors have found that, surprisingly, the incorporation of titanium dioxide in the afore-mentioned amounts maintains adhesion while simultaneously reducing or eliminating yellowing of the film upon prolonged exposure to UV-containing light. The titanium dioxide particles are preferably coated with a coating comprising or consisting of at least one metal oxide selected from alumina and zirconia, and preferably wherein the coating comprises or consists of alumina, and preferably the coating does not contain silica (particularly when the heat-sealable layer (A) comprises a glycidyl ester hydrolysis stabiliser).

In a preferred embodiment, heat-sealable layer (A) is optically clear or translucent. As used herein, the term "optically clear" refers to a layer that provides a percentage of scattered light in the visible wavelength range of no more than 30%, preferably no more than 15% preferably no more than 10%, preferably no more than 6%, more preferably no more than 3.5% and particularly no more than 1.5%, and/or a total luminous transmission (TLT) for light in the visible region (400 nm to 700 nm) of at least 80%, preferably at least 85%, more preferably at least about 90%. Preferably, an optically clear layer fulfils both of these criteria. As used herein, the term "translucent" refers to a layer having a TLT of at least 50%, preferably at least 60%, and preferably at least 70%.

The inventors of the present application surprisingly found that the films of the present invention comprising a filled base layer (B) and further comprising a heat-sealable layer (A) free of particulate filler or containing particulate filler only in minor amounts do not suffer from delamination resistance. It might have been expected that heat-sealable layer (A) would have required significant amounts of pigment in order to avoid delamination from the filled base layer (B).

In a further preferred embodiment, base layer (B) contains a particulate filler (preferably selected from titanium dioxide and/or barium sulphate, preferably in the amounts described above) and is opaque (preferably a white opaque layer), and heat-sealable layer (A) is optically clear or translucent and is free of particulate filler or contains particulate filler only in minor amounts as described above.

Base layer (B) and/or heat-sealable layer (A) of the film may further comprise any other additive conventionally employed in the manufacture of polyester films. Thus, additives such as cross-linking agents, dyes, pigments, voiding agents, lubricants, antioxidants, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate. Such components may be introduced into the polymer in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology as described above may also be employed.

In a first Embodiment E1, the film comprises two layers and has an AB-layer structure. In this embodiment, the film is disposed in the photovoltaic cell such that heat-sealable layer (A) is disposed towards the encapsulant resin (i.e. towards the encapsulated photo-active layers) and base layer (B) is disposed in the opposed direction and towards the exterior of the PV cell, preferably wherein base layer (B) is the outermost layer of the PV cell. In this embodiment, base layer (B) preferably comprises a hydrolysis stabiliser and a UV-stabiliser and preferably also a particulate filler, as described hereinabove. In this embodiment, heat-sealable layer (A) preferably comprises no or substantially no hydrolysis stabiliser, and preferably no or substantially no UV-stabiliser. In other words, preferably no hydrolysis stabiliser is present or added to heat-sealable layer (A), and so the amount of any hydrolysis stabiliser in layer (A) is preferably less than 0.01% by weight, based on the weight of the polyester in the layer. Similarly, preferably no UV-stabiliser is present or added to heat-sealable layer (A), and so the amount of any UV-stabiliser in layer (A) is preferably less than 0.01% by weight, based on the weight of the polyester in the layer. In this embodiment, it is preferred that layer (A) is free of particulate filler or contains particulate filler only in minor amounts as described hereinabove, for instance in amounts of no more than 2.5% by weight, or no more than 2% by weight, or no more than 1% by weight, or no more than 0.6% by weight, or no more than about 0.3% by weight, based on the weight of the polyester in the layer; or for instance the layer (A) may comprise titanium dioxide particles in an amount of at least 0.3%, preferably at least 1.0%, preferably at least 2.0%, and preferably no more than 4.0%, preferably no more than 3.0%, preferably less than 3.0% and preferably no more than 2.5% by weight based on the weight of the polyester in the layer, and particularly preferred ranges are from 2.0 to 4.0% and from 0.3 to less than 3.0% (or no more than 2.5%) by weight, based on the weight of the polyester in the layer.

In a second Embodiment E2, the film comprises said base layer (B) and said heat-sealable layer (A), and further comprises a polyester layer (C) which is disposed on base layer (B) on the opposite side thereof to heat-sealable layer (A). In this embodiment, the film is disposed in the photovoltaic cell such that heat-sealable layer (A) is disposed towards the encapsulant resin (i.e. towards the encapsulated photo-active layers) and the layer (C) is disposed in the opposite direction and towards the exterior of the PV cell. In this embodiment, it is preferred that said base layer (B) comprises a hydrolysis stabiliser as described hereinabove, and preferably said layer (A) comprises no or substantially no hydrolysis stabiliser. In this embodiment, it is preferred that base layer (B), and preferably also layer (A), contains no or substantially no UV-stabiliser, i.e. preferably no UV-stabiliser is present or added to base layer (B) and preferably neither to heat-sealable layer (A), and so the amount of any UV-stabiliser in layer (B) or layer (A) is preferably less than 0.01% by weight, based on the weight of the polyester in the layer. In this embodiment, said layer (C) preferably comprises a UV-stabiliser as described hereinabove, and optionally further comprises a hydrolysis stabiliser as described hereinabove. In this embodiment, it is preferred that layer (A) is free of particulate filler or contains particulate filler only in minor amounts as described hereinabove, for instance no more than 2.5% by weight, or no more than 2% by weight, or no more than 1% by weight, or no more than 0.6% by weight, or no more than about 0.3% by weight, based on the weight of the polyester in the layer; or for instance, the layer (A) may comprise titanium dioxide particles in an amount of at least 0.3%, preferably at least 1.0%, preferably at least 2.0%, and preferably no more than 4.0%, preferably no more than 3.0%, preferably less than 3.0% and preferably no more than 2.5% by weight based on the weight of the polyester in the layer, and particularly preferred ranges are from 2.0 to 4.0% and from 0.3 to less than 3.0% (or no more than 2.5%) by weight, based on the weight of the polyester in the layer. In this embodiment, it is preferred that at least one, and preferably only one, of layer (B) and layer (C) comprise particulate filler as an opacifying agent as described hereinabove for layer (B), i.e. preferably comprising from about 0.3 to about 30% by weight based on the weight of polyester in the layer, and with reference to the preferred particulate filler amounts and identities of layer (B). Where layer (B) of Embodiment E2 comprises particulate filler as described hereinabove, i.e. comprising from about 0.3 to about 30% by weight based on the weight of polyester in the layer, it is preferred that layer (C) is free of particulate filler or contains particulate filler only in minor amounts for the purpose of improving handling, preferably no more than 2.5% by weight, preferably no more than 2% by weight, preferably no more than 1% by weight, more preferably no more than 0.6% by weight, and in one embodiment no more than about 0.3% by weight, based on the weight of the polyester in the layer.

It will appreciated that the amounts and identities of the UV-stabiliser and hydrolysis stabiliser to be used in the respective layers of each of Embodiments E1 and E2 are those provided hereinabove in the detailed description of the UV-stabiliser and hydrolysis stabiliser additives.

The polyester layer (C) in Embodiment E2 may comprise a crystallisable polyester or an amorphous polyester.

Where the polyester layer (C) comprises a crystallisable polyester, the polyester of layer (C) is preferably independently selected from those polyesters described hereinabove for base layer (B), wherein the polyester of the layer (C) may be the same as or different to the polyester of base layer (B), and is preferably selected from polyethylene terephthalate or polyethylene naphthalate, preferably polyethylene terephthalate. The polyester resin of the polyester layer (C)

is the major component of the layer, and makes up at least 50% by weight of the total weight of the layer, preferably at least 65%, preferably at least 80%, preferably at least 90%, more typically at least 95% by weight of the total weight of the layer. In this embodiment, the layer (C) is preferably the outermost layer of the PV cell. In this embodiment, said layer (C) preferably comprises a UV-stabiliser as described hereinabove and a hydrolysis stabiliser as described hereinabove. In this embodiment, said layer (C) preferably further comprises particulate filler as an opacifying agent in an amount of from about 0.3 to about 30% by weight based on the weight of polyester in the layer, as described hereinabove for the preferred particulate filler amounts and identities of layer (B). In this embodiment, layer (B) may comprise reclaimed film but otherwise no or substantially no particulate filler is added to layer (B) (wherein "substantially no" in this context means no more than 2.5% by weight, preferably no more than 2% by weight, preferably no more than 1% by weight, more preferably no more than 0.6% by weight, and preferably no more than about 0.3% by weight, based on the weight of the polyester in the layer).

Where the polyester layer (C) comprises an amorphous polyester, the polyester of layer (C) is preferably independently selected from those polyesters described hereinabove for heat-sealable layer (A), wherein the polyester of the layer (C) may be the same as or different to the polyester of heat-sealable layer (A), i.e. it is derived from an aliphatic diol and a cycloaliphatic diol and at least one aromatic dicarboxylic acid. Preferably, the amorphous polyester of said layer (C) is the same as the amorphous polyester of said layer (A), such that the ABC-type layer structure of Embodiment E2 becomes an ABA-type layer structure. The polyester resin of the polyester layer (C) is the major component of the layer, and makes up at least 50% by weight of the total weight of the layer, preferably at least 65%, preferably at least 80%, preferably at least 90%, more typically at least 95% by weight of the total weight of the layer. In this embodiment, said layer (C) preferably comprises a UV-stabiliser as described hereinabove. In this embodiment, layer (C) optionally comprises a hydrolysis stabiliser, but preferably does not comprise a hydrolysis stabiliser. In this embodiment, preferably layer (B) comprises particulate filler as an opacifying agent as described hereinabove and layer (C) is free of particulate filler or contains particulate filler only in minor amounts as described hereinabove, for instance no more than 2.5% by weight, or no more than 2% by weight, or no more than 1% by weight, or no more than 0.6% by weight, or no more than about 0.3% by weight, based on the weight of the polyester in the layer. In this embodiment, and particularly wherein the amorphous polyesters of the (A) and (C) layers are the same such that the polyester film exhibits an ABA-type layer structure, there is preferably disposed on the outer surface of layer (C) an anti-blocking layer (D), preferably wherein the layer (D) is disposed onto the surface of layer (C) via an in-line coating technique (as discussed in more detail below). It will be appreciated that there is no anti-blocking layer on the surface of the layer (A), which is the surface of the film which should remain adherable to the encapsulant resin in the PV cell. As used herein, the term "blocking" refers to the handling problem which can be exhibited by polyester films, particularly in reel-to-reel processes, wherein the film becomes stuck on a surface of film manufacturing or processing equipment (e.g. rollers). While the amorphous heat-sealable layer (A) of the present invention provides unexpectedly good adhesion strength to the encapsulant of the PV cell, and also unexpectedly good hydrolysis resistance, the copolyester of the layer (A) tends to have a lower melting point than PET homopolymer and this can interfere with the processability of the film in the manufacture of a PV cell, particularly in a reel-to-reel process, since PV cell manufacture is typically conducted at elevated temperatures. The use of an anti-blocking layer (D) on one surface of the polyester film as described above advantageous in that it allows the manufacture of a film having a symmetrical ABA-type layer structure, which can be more economical (at least in terms of the capital cost of the equipment) than an ABC-layer structure, while retaining the advantages of high adhesion strength and hydrolytic stability of the heat-sealable layer (A) disclosed herein.

The anti-blocking layer (D) comprises a polymeric resin, such that the polymeric resin is the major component of layer (D) and makes up at least 50% by weight of the total weight of the layer, preferably at least 65%, preferably at least 80%, preferably at least 90%, typically at least 95%, and in one embodiment at least 99% by weight of the total weight of layer (D). The polymeric resin is preferably a cross-linkable resin.

The polymeric resin of the anti-blocking layer (D) is preferably an acrylic resin, preferably selected from acrylate and methacrylate resins. The acrylic resin is preferably a cross-linkable resin. As used herein, the term "acrylate and methacrylate resin" refers to a resin comprising acrylate and/or methacrylate monomer units wherein at least 50 mol %, preferably at least about 60 mol %, preferably at least about 70 mol %, preferably at least about 80 mol %, of the monomer units are acrylate and/or methacrylate monomer units. Thus, the acrylic resin preferably comprises at least one monomer derived from an ester of acrylic acid and/or methacrylic acid, preferably an alkyl ester where the alkyl group is a $C_{1-10}$ alkyl group such as methyl, ethyl, n-propyl, isopropyl, n-butyl, iso-butyl, ter-butyl, hexyl, 2-ethylhexyl, heptyl, and n-octyl. Preferably, the acrylic resin comprises said alkyl acrylate monomer units and/or alkyl methacrylate monomer units such that they constitute at least about 50 mol %, preferably at least about 60 mol %, preferably at least about 70 mol %, preferably at least about 80 mol %, of the monomer units of the acrylic resin. Said alkyl acrylate monomers are preferably ethyl acrylate (EA) or butyl acrylate (BA), and preferably ethyl acrylate. Said alkyl methacrylate monomer is preferably methyl methacrylate (MMA).

The acrylic resin preferably further comprises one or more cross-linkable monomer(s), as are known in the art, such as methacrylamide (MA), acrylamide, N-methylol methacrylamide, N-methylol acrylamide and the like. Methacrylamide is a particularly preferred further cross-linkable monomer. Such cross-linkable monomers may be present additionally to the cross-linking agents referred to herein. Other monomer units which may be present in the resin include acrylic acid, methacrylic acid, acrylonitrile, methacrylonitrile, halo-substituted acrylonitrile, halo-substituted methacrylonitrile, N-hydroxyethyl acrylamide, N-hydroxypropyl acrylamide, N-hydroxyethyl methacrylamide, N-methyl acrylamide, N-tertiary butyl acrylamide, hydroxyethyl methacrylate, glycidyl acrylate, glycidyl methacrylate, dimethylamino ethyl methacrylate, itaconic acid, itaconic anhydride and half esters of itaconic acid, vinyl esters such as vinyl acetate, vinyl chloroacetate, vinyl benzoate, vinyl pyridine, vinyl chloride, vinylidene chloride, maleic acid, maleic anhydride, styrene and derivatives of styrene such as chloro styrene, hydroxy styrene and alkylated styrenes, wherein the alkyl group is a $C_{1-10}$ alkyl group. Such monomeric units may be copolymerised as optional additional monomers with the afore-mentioned acrylate and/or methacrylate monomer units.

Preferably, the acrylic resin is a methacrylate resin, preferably an alkyl methacrylate resin, preferably a methyl methacrylate resin, and preferably further comprising acrylate monomer units, preferably alkyl acrylate monomer units. In this embodiment, the fraction of said methacrylate monomer units preferably constitutes at least about 30 mol %, preferably at least about 40 mol %, and in one embodiment at least about 50 mol %, of the monomer units of the acrylic resin, and preferably wherein the fraction of said acrylate monomer units constitutes at least about 30 mol %, preferably at least about 40 mol %, and in one embodiment at least about 50 mol %, of the monomer units of the acrylic resin. In this embodiment, the fraction of said methacrylate monomer units is preferably in the range of from about 40 mol % to about 55 mol %, and the fraction of said acrylate monomer units is preferably in the range of from about 40 mol % to about 55 mol %, of the monomer units of the acrylic resin. In this embodiment, the acrylic resin preferably further comprises one or more cross-linkable monomer (s), preferably selected from methacrylamide, acrylamide, N-methylol methacrylamide and N-methylol acrylamide, and preferably from methacrylamide, wherein the fraction of said cross-linkable monomer(s) is preferably in the range of from about 1 to about 10 mol %, preferably from about 2 to about 8 mol % of the monomer units of the acrylic resin.

The molecular weight ($M_n$) of the acrylic resin is typically within the range 40,000 to 300,000, and more preferably within the range 50,000 to 200,000, as measured by gel permeation chromatography.

The acrylic resin preferably comprises a cross-linking agent. Suitable cross-linking agents comprise epoxy resins, alkyd resins and/or condensation products of an amine (e.g. melamine, diazine, urea, cyclic ethylene urea, cyclic propylene urea, thiourea, cyclic ethylene thiourea, alkyl melamines, aryl melamines, glycoluril, benzoguanamines, guanamines, alkyl guanamines and aryl guanamines) with an aldehyde (e.g. formaldehyde). Isocyanates (including blocked isocyanates), as known in the art, may also be used. The cross-linking agents are preferably selected from condensation products of an amine (preferably melamine) with an aldehyde (preferably formaldehyde). The condensation product may optionally be partially or totally alkylated, the alkyl group preferably being of low molecular weight, preferably $C_{1-4}$, preferably methyl, ethyl, n-butyl or iso-butyl. Such compounds may be synthesised via the condensation of formaldehyde with the amine, optionally followed by alkylation of the resulting methylol groups with an alcohol. In a preferred embodiment, the cross-linking agents are selected from melamine-formaldehyde cross-linkers, and preferably from methylated melamine-formaldehyde cross-linkers, such as those commercially available as CYMEL® 350 and 3745 (Cytec Industries). A hexamethoxymethyl melamine condensate is particularly suitable. A catalyst is preferably used in association with the cross-linking agent to promote and/or accelerate inter-molecular cross-linking, as is known in the art. Suitable catalysts for cross-linking melamine formaldehyde are acid catalysts. Preferred catalysts include ammonium chloride, ammonium nitrate, ammonium thiocyanate, ammonium dihydrogen phosphate, diammonium hydrogen phosphate, para-toluene-sulphonic acid, sulphuric acid, maleic acid stabilised by reaction with a base, ammonium para toluene sulphonate and morpholinium para toluene sulphonate.

A suitable cross-linkable acrylic resin for use in the present invention is Rhoplex® 3208 (Rohm & Haas), which is an acrylic resin in the form of an aqueous dispersion comprising about 34-35 wt % of an acrylic binder (MMA/EA/MA), and further comprising about 8-9 wt % of a formaldehyde-melamine cross-linker.

The anti-blocking layer (D) may be formed using any suitable technique, but is preferably disposed onto layer (C) of the film via a conventional coating technique known in the art, such as gravure roll coating, reverse roll coating, dip coating, bead coating, extrusion-coating, melt-coating or electrostatic spray coating, preferably wherein the coating step avoids the use of organic solvent. Layer (D) may be coating via an off-line or in-line coating technique, but is preferably an in-line coated layer. Thus, the coating of layer (D) onto the film is preferably conducted via an in-line coating process, wherein the coating step takes place during film manufacture and before, during or between any stretching operation(s) employed, and such in-line coating processes are very beneficial to the efficiency and economy of film manufacture. An in-line coating process is distinguished from an off-line coating process in which coating is conducted after the manufacture of the film has been completed. An in-line coating process cannot be used with thick coating layers because of the limitations of the application process, such as the drying capacity of the coating line and the practical upper limit on the solids content and viscosity of the coating composition. The dry thickness of layer (D), i.e. in the finished film and after the stretching operation(s) conducted during film manufacture, is preferably in the range of from about 0.01 µm to about 10 µm, and preferably from about 0.1 µm to about 5 µm, and preferably no more than about 1.0 µm.

The film described herein preferably has a total thickness in the range of from about 100 to about 500 µm, or from about 200 µm to about 500 µm, preferably no more than about 350 µm, preferably no more than about 300 µm, and preferably at least 125 µm or at least about 250 µm, or at least about 275 µm.

The thickness of base layer (B) is greater than 50%, preferably at least 60%, more preferably at least 70% and preferably from about 75% to about 95% of the total thickness of the film. The thickness of the layer (B) is preferably no more than about 300 µm, preferably no more than about 280 µm, and preferably in the range of from about 100 to about 300 µm, or from about 250 to about 280 µm.

The thickness of heat-sealable layer (A) is preferably no more than 40%, more preferably no more than 30% and more preferably no more than 25%, and preferably at least 2.5% more preferably at least 10%, and preferably from about 5% to about 25%, of the total thickness of the film. The thickness of the layer (A) is preferably less than about 50 µm, preferably less than about 30 µm, preferably less than about 25 µm, and preferably in the range of from about 10 to about 25 µm. If the thickness of layer (A) is too great, the hydrolysis resistance of the layer deteriorates.

The thickness of optional polyester layer (C) is preferably no more than 40%, more preferably no more than 30% and more preferably no more than 25%, and preferably at least 2.5% more preferably at least 10%, and preferably from about 5% to about 25%, of the total thickness of the film. Where optional layer (C) comprises an amorphous polyester, the thickness of the layer is preferably less than about 50 µm, preferably less than about 30 µm, preferably less than about 25 µm, and preferably in the range of from about 10 to about 25 µm The advantage of the polyester films disclosed herein which comprise relatively thin functional outer layer(s) (A) and (C) is to enable the manufacture of a film having the requisite functionality at a lower cost, since it is more economical to add an expensive functional additive (such as a UV-stabiliser and/or hydrolysis stabiliser) only into a thin outer layer and not into the base layer, rather than the functional additive being present throughout the whole film According to a further aspect of the invention, there is provided a polyester film comprising a base layer (B) comprising a crystallisable polyester and a heat-sealable layer (A) comprising an amorphous copolyester wherein:
(i) said amorphous copolyester is derived from an aliphatic diol and a cycloaliphatic diol and at least one aromatic dicarboxylic acid;
(ii) preferably wherein said layer (B) comprises an opacifying agent;
(iii) said polyester film further comprises a polyester layer (C) which is disposed on the base layer (B) on the opposite side thereof to the heat-sealable layer (A);

(iv) preferably wherein said layer (C) comprises amorphous polyester derived from an aliphatic diol and a cycloaliphatic diol and at least one aromatic dicarboxylic acid, preferably wherein the amorphous polyester of said layer (C) is the same as the amorphous polyester of said layer (A); and
(v) an anti-blocking layer (D) is disposed on the outer surface of layer (C).

According to a further aspect of the invention, there is provided a polyester film as described herein comprising a base layer (B) comprising a crystallisable polyester and a heat-sealable layer (A) comprising an amorphous copolyester wherein:
(i) said amorphous copolyester is derived from an aliphatic diol and a cycloaliphatic diol and at least one aromatic dicarboxylic acid;
(ii) said base layer (B) comprises at least one hydrolysis stabiliser, and preferably further comprises at least one UV-stabiliser, and preferably further comprises an opacifying agent.

The films of the present invention are particularly suitable for use in PV cells, and particularly as, or as a layer present in, the back-plane of a PV cell. As noted above, a PV cell is a multilayer assembly typically comprising a front-plane, electrode and photovoltaic-active layers, and a back-plane, and further comprising a front-side encapsulant material and a rear-side encapsulant material. Thus, according to a further aspect of the present invention, there is provided the use of a film as defined herein as a layer in a PV cell, and particularly as, or as a layer present in, a back-plane in a PV cell. In such use, the film is disposed in the PV cell such that layer (A) is in contact with encapsulant material.

One of the advantages of the films described herein is that the films (and specifically the layer (A) of said films) exhibit surprisingly good and improved adhesion to the encapsulant materials used in PV cells, particularly ethylene vinyl acetate (EVA) copolymer resins, typically wherein the vinyl acetate component is in the range of from about 10 to about 35 wt %, preferably from about 15 to about 35 wt %, preferably from about 20 to about 35 wt %, preferably from about 25 to about 35 wt %, and preferably form about 28 to about 33 wt %. Suitable EVA encapsulating materials include commercially available Elvax® resins (DuPont, including grades PV1410 to PV1650Z).

Other encapsulant materials include ionomer-based materials, i.e. polymers made up primarily of non-polar repeat units with a minor proportion (typically no more than about 15 wt %) of salt-containing units. Typical ionomers include thermoplastic carboxylate ionomers wherein the non-polar comonomers are selected from ethylene and styrene (preferably ethylene), and containing a minor proportion of salt-containing units such as metal salts (for instance, alkali metal or zinc salts) of methacrylic acid and/or acrylic acid. Exemplary ionomeric encapsulant materials are the copolymers of ethylene and methacrylic acid and/or acrylic acid partially or completely neutralised with alkali metals or zinc, for instance Surlyn® (DuPont; for instance grade 1702). Other encapsulant materials include selected from polyvinylbutyral resins, also commercially available from DuPont (for instance the PV5200 series), and from silicone resins (for instance, Dow Corning's PV-6100 series of optically clear silicone encapsulants). Other encapsulant materials include polyolefins, such as homopolymers and copolymers of ethylene, for instance copolymers with acrylates and/or methacrylates such as methacrylic acid and/or acrylic acid.

The adhesion strength between an encapsulant material (preferably EVA) and the layer (A) of the film described herein is such that the linear average load is at least 40 N/cm, measured as described herein.

The film of the present invention is also suitable for use in any environment in which hydrolytic stability is critical, for instance for a prolonged period in humid conditions at elevated temperatures, and in exterior applications. As used herein, the term "prolonged period in humid conditions at elevated temperatures" refers to the environmental conditions which the film experiences during use, for instance as a PV cell, and preferably as measured by an accelerated ageing test using the damp-heat test described herein (85° C. and 85% relative humidity over a period of at least 500 hours, preferably at least 1000 hours).

The film of the present invention may further be used in the manufacture of electronic or opto-electronic devices, such as electroluminescent (EL) display devices (particularly organic light emitting display (OLED) devices), electrophoretic displays (e-paper) and semiconductor devices (such as organic field effect transistors, thin film transistors and integrated circuits generally).

The flexible polyester films disclosed herein as layer(s) in electronic devices allows the manufacture of such devices in a reel-to-reel process, thereby reducing cost.

The films of the present invention preferably exhibit a hydrolysis resistance such that the adhesion strength of the heat-sealable layer (A) of the film to an encapsulant material (preferably EVA) is at least 40N/cm (measured as the linear average load, as described herein) after accelerated ageing at 85° C. and 85% relative humidity for at least 500 hours, and preferably at least 1000 hours.

Property Measurement

The following analyses were used to characterize the films described herein:
(i) Clarity is evaluated by measuring total luminance transmission (TLT) and haze (% of scattered transmitted visible light) through the total thickness of the film using an M57D spherical hazemeter (Diffusion Systems) according to the standard test method ASTM D1003.
(ii) Transmission Optical Density (TOD) is measured using a Macbeth Densitometer TR 927 (obtained from Dent and Woods Ltd, Basingstoke, UK) in transmission mode.
(iii) Whiteness index is measured using a Colorgard System 2000, Model/45 (manufactured by Pacific Scientific) and the principles of ASTM D 313.
(iv) Intrinsic viscosity (in units of dL/g) of the polyester and polyester film is measured by solution viscometry in accordance with ASTM D5225-98(2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
$\eta q$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).
(v) Hydrolysis resistance may be assessed by subjecting the film to treatment at 85° C. and 85% relative humidity for up to 1000 hours (the "damp-heat test" (DHT)). The samples were placed in a Binder Constant Climate Chamber (model KBF115 (E2)) set at the aforementioned temperature and humidity for a fixed duration. The samples are allowed to dry for 24 hrs at room temperature and humidity before analysis. Properties relating to the aging of the polymer may then be measured at various time intervals. In particular, the adhesion strength to an encapsulant EVA layer may be measured, as described below.
(vi) Adhesion strength of the film to an encapsulant barrier layer (380 μm EVA sheet (Evasa Solarcap® FC100011E)) is assessed using a 180° peel test. The EVA sheet was sandwiched between two samples (having A4 dimensions) of the film to be tested (such that the amorphous layer (A) of each film sample is contacted with the EVA layer) The EVA sheet has dimensions of about 10 cm by about 20 cm and is aligned centrally with the A4 film samples such that the long axis of the EVA sheet is in the same direction as the long axes of the A4 film samples to be tested. Two Teflon® strips (each approximately 75 μm in thickness) are disposed between the EVA sheet and the upper film sample to be tested such that each Teflon® strip creates a temporary interlayer between the upper A4 film sample and an area at each end of the EVA sheet (wherein said area extends across the width of the EVA sheet and longitudinally from the end of the short edge of the sheet to approximately 1 cm from the short edge of the sheet). Each Teflon® strip extends across the width of the A4 film sample and from each short edge of the EVA sheet to the nearest short edge of the A4 film sample. The purpose of the Teflon® strips is to create an initiation point for the adhesion peel test. This assembly is laminated together at a heat-seal temperature of 150° C. for 20 minutes in a press providing a pressure of 1.25 tonnes over the A4 area of the sheet. The Teflon® strips are removed after lamination. The laminated assembly of film/EVA-sheet/film is left for 72 hours at room temperature and humidity before further analysis in order to ensure that the EVA is fully cured. In the region of the A4 assembly where the EVA sheet is present, the laminate is cut longitudinally into strips (2.54 cm in width). The peel test is conducted using a peel speed of 25.4 cm/min, a peel length of 152 mm and a jaw gap of 25 mm. Adhesion strength may be expressed either as the linear peak load or linear average load. The adhesion strength of the film is measured in one or both of the following ways:
(1) As the initial dry adhesion strength;
(2) As the adhesion strength after being subjected to the "damp-heat test" treatment noted above.
The films of the present invention preferably exhibit a linear average adhesion strength of at least 40 N/cm (23 lbf) in the dry adhesion strength, and preferably also in the damp-heat test.
(vii) The polyester film is tested for weatherability according to ISO 4892-2.
(viii) Thermal shrinkage is assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.
(ix) Differential scanning calorimeter (DSC) scans are obtained using a Perkin Elmer DSC 7 instrument. Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C. A sample plot is shown in FIG. 1.
(x) The amount of hydrolysis stabiliser in the final film may be measured by $^1$H NMR (D2-1,1,2,2-tetrachloroethane as solvent; GSX-Delta 400 instrument at 80° C.).

The invention is further illustrated by reference to the following examples. The examples are not intended to limit the scope of the invention as described above.

EXAMPLES

In the following discussion, intrinsic viscosity values are those measured on the polymer chip unless otherwise specified, and reference to "PETG" is to a copolyester of terephthalic acid, 1,4-cyclohexanedimethanol and ethylene glycol (33:67 CHDM:EG) (Skygreen™ S2008 (IV=0.79), optionally blended with Skygreen™ PN100 (IV=0.70)) unless otherwise specified.

Several multi-layer films based on polyethylene terephthalate (PET) and comprising at least two layers were extruded and cast using a standard melt coextrusion system. The coextrusion system was assembled using two independently operated extruders which fed separate supplies of polymeric melt to a standard coextrusion block or junction at which these streams were joined. From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 6.5 m/min and was approximately 1280 mm in width. The cast extrudate was stretched in the direction of extrusion to approximately 3 times its original dimensions at a temperature of 82° C. The cooled stretched film was then passed into a stenter oven at a temperature of 115° C. where the film was dried and stretched in the sideways direction to approximately 3.4 times its original dimensions. The biaxially stretched film was heat-set at temperatures in the range of from 220 to 230° C. The identities and final thicknesses of the layers in the resulting films are described in further detail below. This manufacturing method is applicable to Comparative Examples 1, 2 and 3 below.

Comparative Example 1

A 230 μm three-layer film was manufactured in accordance with the above procedure to prepare a film having an ABA layer structure. The polyesters were fed at a rate of 130:1740:130 kg/hr (A:B:A). The PET polyester from which layer A was made comprised 18 wt % BaSO$_4$ and exhibited an IV of 0.81. Hydrolysis stabiliser (Cardura™ E10P) was added to each layer A at a rate of 3.6 liters/hour during the film manufacturing process. In addition, UV-stabiliser (Tinuvin® 1577) was added (via a 20 wt % PET-based masterbatch at a rate of 13 kg/hr) to provide a concentration of 1 wt % of the UV-stabiliser in each layer of the final film. Each Layer A was 15 μm thick. The PET from which the Layer B was made comprised 41 wt % of PET polymer having an IV of 0.79; 22 wt % of a PET polymer having an IV of 0.81 and comprising 18 wt % BaSO$_4$; and 37 wt % of reclaimed film. Hydrolysis stabiliser (Cardura™ E10P) was added to layer B at a rate of 6 liters/hour during the film manufacturing process. Layer B was 200 μm thick.

Comparative Example 2

A 212 μm three-layer film was manufactured in accordance with the above procedure to prepare a film having an ABA layer structure. The polyesters were fed at a rate of 130:1740:130 kg/hr (A:B:A). The PET polymer from which each layer A was made had an IV of 0.79. Prior to film formation, TiO$_2$ was added at a level of 14 wt % (via a 60% PET-based masterbatch) and UV-stabiliser (Tinuvin® 1577) was added at a level of 1 wt % (via a 20% PET-based masterbatch). Hydrolysis stabiliser (Cardura™ E10P) was added to each layer A at a rate of 1.2 liters/hour during the film manufacturing process. Each layer A was 14 μm in thickness. The PET from which the layer B was made had an IV of 0.79. Prior to film formation, TiO$_2$ was added at a level of 8 wt % TiO$_2$ (via a 60 wt % PET-based masterbatch). Hydrolysis stabiliser (Cardura™ E10P) was added to layer B at a rate of 6 liters/hour during the film manufacturing process. Layer B comprised 35% reclaimed film. Layer B was 184 μm in thickness.

Comparative Example 3

A 265 μm three-layer film was manufactured in accordance with the above procedure to prepare a film having an ABA layer structure. The polyesters were fed at a rate of 130:1740:130 kg/hr (A:B:A). The PET polymer used to prepare each layer A had an IV of 0.79. Prior to film formation, TiO$_2$ was added at a level of 14 wt % (via a 60% PETG-based masterbatch) and UV-stabiliser (Tinuvin® 1577) was added at a level of 1 wt % (via a 20% PET-based masterbatch). Hydrolysis stabiliser (Cardura™ E10P) was added to each layer A at a rate of 1.2 liters/hour during the film manufacturing process. Each layer A was 17.5 μm in thickness. Each layer A in the final film comprised PETG in an amount of 9.2 wt %. The PET from which the layer B was made had an IV of 0.79. Prior to film formation, TiO$_2$ was added at a level of 8 wt % TiO$_2$ (via a 60 wt % PETG-based masterbatch). Hydrolysis stabiliser (Cardura™ E10P) was added to layer B at a rate of 6 liters/hour during the film manufacturing process. Layer B comprised 35% reclaimed film. Layer B was 230 μm in thickness.

Comparative Example 4

Commercially available 50 μm Melinex® D389 film (DuPont Teijin Films) was used for this examples. The film has a coextruded AB structure, wherein:
Layer A=copolyester of PET with isophthalic acid (IPA) (TA:IPA=82:12) with a thickness 10 μm; and
Layer B=PET comprising 0.125 wt % China clay filler, and 1.5% Tinuvin® 1577 UV-absorber, with a thickness 40 μm.

Comparative Example 5

This comparative example is Melinex® D387 film (DuPont) having a thickness of 30 μm. The film has the same layer composition and structure as Melinex® D389 except that the PET layer comprises 4% Tinuvin® 1577 UV-stabiliser. The thickness of the B-layer is 24 μm.

Comparative Example 6

This comparative example is Melinex® M342 film (DuPont) having a thickness of 100 μm. The film is clear with a coextruded ABA layer structure comprising an unfilled PET base layer (B). The outer layers (A) are made from the same copolyester of PET with isophthalic acid (IPA) (TA:IPA=82:12) used in Melinex® D389 and D387 and further comprising 0.125 wt % China clay filler. The PET base layer (B) does not contain Tinuvin® 1577 UV-stabiliser. The thickness of the base layer (B) is about 73 μm with two approximately equal layers (A) on either side.

The comparative examples above were tested in the dry adhesion test described hereinabove and the results are presented in Table 1 below.

TABLE 1

| | Dry Adhesion | |
|---|---|---|
| Sample | Max Peak (N/cm) | Linear Average (N/cm) |
| Comp. Ex. 1 | 3 | 2 |
| Comp. Ex. 2 | 7 | 2 |
| Comp. Ex. 3 | 12 | 6 |
| Comp. Ex. 4 | 34 | 22 |

Comparative Examples 1 and 2 demonstrate that the filled PET film performs poorly in the dry adhesion test. Comparative Example 3 demonstrates that small amounts of PETG copolyester blended into the PET can increase the dry adhesion, albeit only by a relatively small amount, and below the target adhesion strength. Comparative Example 4 (the Melinex® D389 film) demonstrates that the IPA-containing copolyester increased dry adhesion strength, but below the target. Comparative Example 5 (Melinex® D387) exhibited an adhesion strength effectively the same as Comparative Example 4 because the D389 and D387 films use the same IPA-containing copolyester in the heat-sealable layer (A). The same is true of Comparative Example 6.

Example 1

From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 7 m/min and was approximately 1250 mm in width. The cast extrudate was stretched in the direction of extrusion to approximately 3 times its original dimensions at a temperature of 82° C. The cooled stretched film was then passed into a stenter oven at a temperature of 115° C. where the film was dried and stretched in the sideways direction to approximately 3.3 times its original dimensions. The biaxially stretched film was heat-set at temperatures in the range of from 200 to 212° C. The final film was 120 μm in thickness and comprised two layers, wherein Layer A (12 μm) was PETG (100% Skygreen™ S2008); and layer B (108 μm) was PET (IV=0.79) comprising 4.5 wt % TiO$_2$ (R-KB-6; Sachtleben). The film was tested in the dry adhesion test. The film was also tested in the damp-heat test described herein, along with the best-performing comparative example from the dry adhesion test, i.e. Comparative Example 4. The results are collated in Table 2 below.

TABLE 2

| Sample | Dry adhesion | | 24 h DHT adhesion | | 120 h DHT adhesion | | 500 h DHT adhesion | |
|---|---|---|---|---|---|---|---|---|
| | Max Peak (N/cm) | Linear Av. (N/cm) | Max Peak (N/cm) | Linear Av. (N/cm) | Max Peak (N/cm) | Linear Av. (N/cm) | Max Peak (N/cm) | Linear Av. (N/cm) |
| C. Ex. 4 | 34.19 | 22.59 | 33.31 | 18.26 | 28.21 | — | — | — |
| Ex. 1 | 63.0 | 46.7 | 63.2 | 49.1 | — | — | 66.7 | 57.2 |

Comparative Example 4 retained some adhesion after 24 hrs in the damp-heat test but failed after about 120 hrs. In contrast, the film of Example 1 according to the present invention exhibited very strong adhesion, even after 500 hours in the damp-heat test. Example 1 also exhibited a very high maximum peak in the adhesion tests.

Examples 2 to 4

From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 10.5 m/min and was approximately 300 mm in width. The cast extrudate was stretched in the direction of extrusion to approximately 3.2 times its original dimensions at a temperature of 78° C. The cooled stretched film was then passed into a stenter oven at a temperature of 110° C. where the film was dried and stretched in the sideways direction to approximately 3.4 times its original dimensions. The biaxially stretched film was heat-set at temperatures in the range of from 190-220° C. The film was a two layer film having an AB-layer structure. In all cases, the B layer was made from a PET homopolymer (IV=0.79), and the A-layer was made from PETG (100% Skygreen™ S2008). The compositions and final thicknesses of the layers in the resulting films are described in more in Tables 3 and 4 below. The UV-stabiliser used in these examples was Tinuvin® 1577 (BASF). The results demonstrate that the film exhibits excellent performance in the damp-heat test.

TABLE 3

| | A Layer | | | B Layer | |
|---|---|---|---|---|---|
| Ex. | Polymer | UV/wt % | T/μm | TiO$_2$/wt % | T/μm |
| 2 | PETG | 1.5 | 20 | 0 | 83 |
| 3 | PETG | 0 | 23 | 4.5 | 82 |
| 4 | PETG | 1.5 | 18 | 4.5 | 94 |

TABLE 4

| | 0 hours | | 24 hours DHT | | 100 hrs DHT | | 500 hrs DHT | |
|---|---|---|---|---|---|---|---|---|
| Ex. | Max peak (N/cm) | Lin. Av. (N/cm) | Max peak (N/cm) | Lin. Av. (N/cm) | Max peak (N/cm) | Lin. Av. (N/cm) | Max peak (N/cm) | Lin. Av. (N/cm) |
| 2 | — | — | — | — | — | — | — | — |
| 3 | 55.6 | 35.4 | 62.2 | 36.2 | 59.8 | 37.3 | 56.2 | — |
| 4 | 39.4 | 35.7 | 57.5 | 43.9 | 63.6 | 45.3 | 60.0 | 42.7 |

Examples 5 to 7

The film of Example 3 was coated on the PETG surface (layer A) with an anti-blocking layer (D) in order to demonstrate the technical effect thereof. The coating composition was a cross-linkable acrylic resin in the form of an aqueous dispersion of AC201 (Rohm & Haas) comprising an acrylic binder (MMA/EA/MA) and formaldehyde-melamine cross-linker, and had the following formulation:
(i) 326 ml AC201 (46%);
(ii) 40 ml Tween 20 (10%);
(iii) 25 ml Ammonium Nitrate (10%); and
(iv) 4209 ml deionised water The coating was applied onto the surface of the finished film at a range of coat thicknesses by gravure coating (60 mesh (G10) gravure; offset arrangement). The adhesion strength of the coated Examples was tested using the dry adhesion test described herein and the results shown in Table 5 below.

TABLE 5

| Example | Acrylic coat thickness (nm) | Max peak (N/cm) | Lin. Av. (N/cm) |
|---|---|---|---|
| 3 | 0 | 55.6 | 35.4 |
| 5 | 40 | 0.247 | 0.157 |
| 6 | 70 | 0.287 | 0.179 |
| 7 | 100 | 0.306 | 0.166 |

The data in Table 5 demonstrate the principle of an anti-blocking layer in the present invention. Such a layer can be used to overcoat a PETG layer, particularly in the symmetrical and more economic ABA film structure having both layers (A) as PETG, such that the adhesion strength of one of the PETG layers (A) to the encapsulant is retained, but the adhesion of the other PETG layer (A) is negated, thereby improving the overall processability and utility of the film.

Examples 8 to 11

From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 7.4 m/min and was approximately 300 mm in width. The cast extrudate was stretched in the direction of extrusion to approximately 2.95 times its original dimensions at a temperature of 75° C. The cooled stretched film was then passed into a stenter oven at a temperature of 110° C. where the film was dried and stretched in the sideways direction to approximately 3.4 times its original dimensions. The biaxially stretched film was heat-set at temperatures in the range of from 190-220° C. The film was a two layer film having an AB-layer structure. The A-layer was made from PETG (75 wt % Skygreen™ S2008 blended with 25 wt % Skygreen™ PN100). Hydrolysis stabiliser (Cardura™ E10P) was optionally added to layer A at a rate of 2.5 ml/kg during the film manufacturing process. TiO$_2$ was optionally added to the A layer to provide a level of 2 wt % TiO$_2$ in the A-layer of the final film. In all cases, the B layer was made from a PET homopolymer (IV=0.79). Hydrolysis stabiliser (Cardura™ E10P) was added to layer B at a rate of 6.5 ml/kg during the film manufacturing process. In addition TiO$_2$ was added to layer B as 60% PETG-based masterbatch to provide 4.5 wt % TiO$_2$ in the B-layer of the final film. Layer B had a thickness of 140.7, 150.8, 145.8 and 157.6 µm in Examples 8, 9, 10 and 11, respectively. The properties of the examples are described in Table 6 below.

TABLE 6

| | A Layer | | | Adhesion | | | |
| | | | | 0 hours | | 100 hours | |
| Ex. | TiO$_2$ (wt %) | Hydrolysis stabiliser | T (µm) | Max peak (N/cm) | Lin. Av. (N/cm) | Max peak (N/cm) | Lin. Av. (N/cm) |
| --- | --- | --- | --- | --- | --- | --- | --- |
| 8 | 0 | no | 21.3 | 76.97 | 60.17 | 74.67 | 60.31 |
| 9 | 0 | yes | 22.2 | 74.46 | 64.22 | 77.06 | 62.34 |
| 10 | 2 | yes | 22.2 | 69.73 | 63.44 | 75.63 | 61.80 |
| 11 | 2 | no | 20.4 | 75.94 | 60.60 | 73.86 | 56.92 |

Adhesion was also tested after 500 hours damp heat treatment. The best performing film was Example 11, which exhibited a maximum peak of 46.52 N/cm and a linear average peak of 31.70 N/cm, which was significantly better than Examples 8 to 10.

Examples 12 to 15

From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 6.7 m/min and was approximately 300 mm in width. The cast extrudate was stretched in the direction of extrusion to approximately 2.95 times its original dimensions at a temperature of 76° C. The cooled stretched film was then passed into a stenter oven at a temperature of 110° C. where the film was dried and stretched in the sideways direction to approximately 3.4 times its original dimensions. The biaxially stretched film was heat-set at temperatures in the range of from 190-220° C. The film was a two layer film having an AB-layer structure. The A-layer was made from PETG (75 wt % Skygreen™ S2008 blended with 25 wt % Skygreen™ PN100). In all cases, the B layer was made from a PET homopolymer (IV=0.79). Hydrolysis stabiliser (Cardura™ E10P) was added to layer B at a rate of 6.5 ml/kg during the film manufacturing process. In addition, TiO$_2$ was added to layer B as 60% PETG-based masterbatch to provide 4.5 wt % TiO$_2$ in the B-layer of the final film. The properties of the examples are described in Table 7 below.

TABLE 7

| | Layer Thickness | | Adhesion | | | |
| | | | 0 hours | | 500 hours | |
| | (µm) | | Max peak | Lin. Av. | Max peak | Lin. Av. |
| Ex. | A | B | (N/cm) | (N/cm) | (N/cm) | (N/cm) |
| --- | --- | --- | --- | --- | --- | --- |
| 12 | 15.4 | 160.9 | 67.13 | 61.11 | 73.65 | 59.32 |
| 13 | 21.2 | 170.6 | 73.94 | 61.18 | 77.33 | 63.16 |
| 14 | 24.8 | 123.9 | 70.33 | 61.09 | 79.45 | 75.14 |
| 15 | 29.0 | 117.7 | 67.11 | 59.53 | 75.35 | 48.87 |

Examples 16 to 24

From the coextrusion block, the melt-streams were transported to a conventional, flat film extrusion die which allowed the melt curtain to be cast from the common coextrusion die at 275° C., and then quenched in temperature onto a rotating, chilled metal drum. The cast film was collected at a process speed of about 8 m/min and was approximately 300 mm in width. The cast extrudate was stretched in the direction of extrusion to approximately 2.95 times its original dimensions at a temperature of 76° C. The cooled stretched film was then passed into a stenter oven at a temperature of 110° C. where the film was dried and stretched in the sideways direction to approximately 3.4 times its original dimensions. The biaxially stretched film was heat-set at temperatures in the range of from 190-220° C. The film was a two layer film having an AB-layer structure. The A-layer was made from PETG (Skygreen™ S2008 optionally blended with Skygreen™ PN100). Hydrolysis stabiliser (Cardura™ E10P) was optionally added to layer A during the film manufacturing process. In all cases, the B layer was made from a PET homopolymer (IV=0.79). Hydrolysis stabiliser (Cardura™ E10P) was added to layer B at a rate of 6.5 ml/kg during the film manufacturing process. In addition, TiO$_2$ was added to layer B as 60% PETG-based masterbatch to provide 4.5 wt % TiO$_2$ in the B-layer of the final film. The properties of the examples are described in Table 8 below.

TABLE 8

| | Layer Thickness (μm) | | Adhesion | | | |
|---|---|---|---|---|---|---|
| | | | 0 hours | | 500 hours | |
| | | | Max peak | Lin. Av. | Max peak | Lin. Av. |
| Ex. | A | B | (N/cm) | (N/cm) | (N/cm) | (N/cm) |
| Layer A: copolyester was 85% S2008 & 15% PN100; hydrolysis stabiliser added at 2.4 ml/kg | | | | | | |
| 16 | 11.2 | 145.3 | 62.50 | 53.34 | 60.03 | 65.86 |
| 17 | 17.9 | 130.3 | 66.08 | 57.23 | 74.99 | 66.62 |
| 18 | 21.1 | 137.5 | 71.32 | 59.86 | 78.10 | 68.81 |
| 19 | 22.0 | 124.5 | 64.92 | 60.52 | 84.52 | 66.52 |
| 20 | 27.8 | 119.3 | 73.07 | 61.63 | 70.38 | 46.78 |
| Layer A: copolyester was 100% S2008; hydrolysis stabiliser added at 3.0 ml/kg | | | | | | |
| 21 | 11.7 | 151.0 | 64.40 | 54.08 | 74.59 | 73.87 |
| 22 | 18.0 | 144.7 | 67.82 | 58.48 | 73.87 | 65.28 |
| 23 | 21.7 | 150.3 | 66.08 | 58.64 | 75.21 | 65.96 |
| 24 | 24.6 | 145.1 | 62.62 | 56.76 | 77.58 | 59.73 |

The invention claimed is:

1. A photovoltaic cell comprising a transparent front-plane, an opaque back-plane and an encapsulant resin wherein said back-plane comprises a polyester film comprising:
    a) a base layer (B) comprising a polyester selected from polyethylene terephthalate or polyethylene naphthalate, and
    b) an amorphous heat-sealable layer (A) comprising an amorphous copolyester, wherein:
    (i) said amorphous copolyester is derived from an aliphatic diol and a cycloaliphatic diol and at least one aromatic dicarboxylic acid wherein the aromatic dicarboxylic acid is terephthalic acid, said aliphatic diol is ethylene glycol and said cycloaliphatic diol is 1, 4-cyclohexanedimethanol;
    (ii) said polyester film is disposed in the photovoltaic cell such that the amorphous heat-sealable layer (A) is in direct contact with the encapsulant resin; and
    (iii) the base layer (B) has a thickness of greater than 50% of the total thickness of the film.

2. The photovoltaic cell according to claim 1 wherein said base layer (B) comprises at least one hydrolysis stabilizer and/or at least one UV-stabilizer.

3. The photovoltaic cell according to claim 1 wherein said layer (A) comprises at least one UV-stabilizer and optionally at least one hydrolysis stabilizer.

4. The photovoltaic cell according to claim 1 wherein said layer (B) comprises an opacifying agent.

5. The photovoltaic cell according to claim 1 wherein said base layer (B) is the outermost layer of the photovoltaic cell.

6. The photovoltaic cell according to claim 5 wherein said base layer (B) comprises at least one hydrolysis stabilizer and at least one UV-stabilizer.

7. The photovoltaic cell according to claim 5 wherein said layer (A) comprises no or less than 0.01% by weight, based on the weight of the polyester in the layer, of hydrolysis stabilizer and/or no or less than 0.01% by weight, based on the weight, based on the weight of the polyester in the layer, of UV-stabilizer.

8. The photovoltaic cell according to claim 5 wherein said layer (A) is free of particulate filler or contains particulate filler in an amount of no more than 2.5% by weight based on the weight of the polyester in the layer, or contains titanium dioxide in an amount from 2.0 to 4.0% or from 0.3 to less than 3.0% by weight based on the weight of the polyester in the layer.

9. The photovoltaic cell according to claim 1 wherein polyester film further comprises a polyester layer (C) which is disposed on the base layer (B) on the opposite side thereof to the heat-sealable layer (A).

10. The photovoltaic cell according to claim 9 wherein said base layer (B) comprises at least one hydrolysis stabilizer, wherein said layer (A) comprises no or less than 0.01% by weight, based on the weight of the polyester in the layer, of hydrolysis stabilizer.

11. The photovoltaic cell according to claim 9 wherein said layer (C) comprises at least one UV-stabilizer.

12. The photovoltaic cell according to claim 9 wherein said layer (A) is free of particulate filler or contains particulate filler in an amount of no more than 2.5% by weight based on the weight of the polyester in the layer, or contains titanium dioxide in an amount from 2.0 to 4.0% or from 0.3 to less than 3.0% by weight based on the weight of the polyester in the layer.

13. The photovoltaic cell according to claim 9 wherein said layer (B) contains no or less than 0.01% by weight, based on the weight of the polyester in the layer, of UV-stabilizer.

14. The photovoltaic cell according to claim 9 wherein said layer (C) comprises a polyester selected from polyethylene terephthalate or polyethylene naphthalate.

15. The photovoltaic cell according to claim 14 wherein said layer (B) or layer (C) comprises an opacifying agent.

16. The photovoltaic cell according to claim 9 wherein there is disposed on the outer surface of layer (C) an anti-blocking layer (D).

17. The photovoltaic cell according to claim 16 wherein said layer (B) comprises an opacifying agent.

18. The photovoltaic cell according to claim 16 wherein said layer (D) is an in-line coated layer.

19. The photovoltaic cell according to claim 16 wherein said layer (D) comprises an acrylic resin.

20. A polyester film comprising:
    a) a base layer (B) comprising a polyester selected from polyethylene terephthalate or polyethylene naphthalate, and
    b) an amorphous heat-sealable layer (A) comprising an amorphous copolyester, wherein:
    (i) said amorphous copolyester is derived from an aliphatic diol and a cycloaliphatic diol and at least one aromatic dicarboxylic acid wherein the aromatic dicarboxylic acid is terephthalic acid, said aliphatic diol is ethylene glycol and said cycloaliphatic diol is 1, 4-cyclohexanedimethanol;
    (ii) said polyester film further comprises a polyester layer (C) which is disposed on the base layer (B) on the opposite side thereof to the amorphous heat-sealable layer (A);

(iii) an anti-blocking layer (D) is disposed on the outer surface of layer (C); and (iv) the base layer (B) has a thickness of greater than 50% of the total thickness of the film.

21. The film according to claim 20 wherein said base layer (B) comprises at least one hydrolysis stabilizer.

22. The film according to claim 20 wherein said layer (C) comprises at least one UV-stabilizer, and optionally further comprises at least one hydrolysis stabilizer.

23. The film according to claim 20 wherein said layer (A) is free of particulate filler or contains particulate filler in an amount of no more than 2.5% by weight based on the weight of the polyester in the layer or contains titanium dioxide in an amount from 2.0 to 4.0% or from 0.3 to less than 3.0% by weight based on the weight of the polyester in the layer.

24. The film according to claim 20 wherein layer (B) contains no or less than 0.01% by weight, based on the weight of the polyester in the layer, of UV-stabilizer.

25. The film according to claim 20 wherein said layer (D) is an in-line coated layer.

26. The film according to claim 20 wherein said layer (D) comprises an acrylic resin.

27. A polyester film comprising:
   a) a base layer (B) comprising a polyester selected from polyethylene terephthalate or polyethylene naphthalate, and
   b) an amorphous heat-sealable layer (A) comprising an amorphous copolyester, wherein:
(i) said amorphous copolyester is derived from an aliphatic diol and a cycloaliphatic diol and at least one aromatic dicarboxylic acid wherein the aromatic dicarboxylic acid is terephthalic acid, said aliphatic diol is ethylene glycol and said cycloaliphatic diol is 1, 4-cyclohexanedimethanol;
(ii) said base layer (B) comprises at least one hydrolysis stabilizer; and
(iii) the base layer (B) has a thickness of greater than 50% of the total thickness of the film.

28. The film according to claim 27 wherein said base layer (B) comprises at least one UV-stabilizer and is the outermost layer of the photovoltaic cell.

29. The film according to claim 27 wherein said polyester film further comprises a polyester layer (C) which is disposed on the base layer (B) on the opposite side thereof to the amorphous heat-sealable layer (A).

30. The film according to claim 29 wherein said layer (C) comprises at least one UV-stabilizer.

31. The photovoltaic cell according to claim 4 wherein said opacifying agent is selected from titanium dioxide and barium sulfate.

32. The photovoltaic cell according to claim 31 wherein said opacifying agent comprises titanium dioxide and is present in the layer (B) in an amount of from about 3 wt % to about 15 wt % based on the total weight of the layer.

33. The photovoltaic cell according to claim 31 wherein said opacifying agent comprises barium sulfate.

34. The photovoltaic cell according to claim 2 wherein the hydrolysis stabilizer is present in said layer (B) in an amount in the range of from 0.10 to 5.0 mol %, based on the amount of polyester in the layer.

35. The photovoltaic cell according to claim 2 wherein the UV-stabilizer in said layer (B) is in the range from 0.2% to 1.5% by weight, relative to the total weight of the layer.

36. The photovoltaic cell according to claim 1 wherein the thickness of base layer (B) constitutes from about 70 to about 95% of the total thickness of the polyester film.

37. The photovoltaic cell according to claim 1 wherein the total thickness of the film is in the range of from about 100 to about 350 μm, and/or the thickness of said layer (A) is from about 10 to about 25 μm.

38. The photovoltaic cell according to claim 1 wherein the molar ratio of the cycloaliphatic diol to the aliphatic diol is in the range from 10:90 to 70:30.

39. The photovoltaic cell according to claim 1 wherein said film is biaxially oriented.

40. The photovoltaic cell according to claim 1 wherein said film is white.

41. The photovoltaic cell according to claim 1 wherein said film exhibits an adhesion strength of the heat-sealable layer (A) of the film to an encapsulant material of at least 40N/cm, measured as the linear average load.

42. The photovoltaic cell according to claim 1 wherein said encapsulant resin is EVA.

* * * * *

UNITED STATES PATENT AND TRADEMARK OFFICE
CERTIFICATE OF CORRECTION

PATENT NO. : 10,439,086 B2
APPLICATION NO. : 15/321313
DATED : October 8, 2019
INVENTOR(S) : Emily Parnham et al.

Page 1 of 1

It is certified that error appears in the above-identified patent and that said Letters Patent is hereby corrected as shown below:

On the Title Page

Item [72], Inventors:
"Julian N. Robinson, Easby (GB)" should read --Julian N. Robinson, Easby North Yorkshire (GB)--.

In the Claims

In Column 33, Line 34; Claim 1:
"aromatic dicarboxylic acid wherein" should read --aromatic dicarboxylic acid, wherein--.

In Column 33, Lines 57-58; Claim 7:
"based on the weight, based on the weight of the polyester" should read --based on the weight of the polyester--.

In Column 34, Line 62; Claim 20:
"aromatic dicarboxylic acid wherein" should read --aromatic dicarboxylic acid, wherein--.

In Column 35, Line 29; Claim 27:
"aromatic dicarboxylic acid wherein" should read --aromatic dicarboxylic acid, wherein--.

Signed and Sealed this
Twenty-fourth Day of March, 2020

Andrei Iancu
*Director of the United States Patent and Trademark Office*